US009692147B1

(12) United States Patent
Nekkanty et al.

(10) Patent No.: US 9,692,147 B1
(45) Date of Patent: Jun. 27, 2017

(54) SMALL FORM FACTOR SOCKETS AND CONNECTORS

(71) Applicant: Intel Corporation, Santa Clara, CA (US)

(72) Inventors: Srikant Nekkanty, Chandler, AZ (US); Donald T. Tran, Phoenix, AZ (US); Gregorio R. Murtagian, Phoenix, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/979,037

(22) Filed: Dec. 22, 2015

(51) Int. Cl.
*H01R 4/48* (2006.01)
*H01R 43/16* (2006.01)
*H05K 5/00* (2006.01)
*H01R 13/73* (2006.01)

(52) U.S. Cl.
CPC ............ *H01R 4/48* (2013.01); *H01R 13/73* (2013.01); *H01R 43/16* (2013.01); *H05K 5/0086* (2013.01)

(58) Field of Classification Search
USPC .......... 439/817, 91, 66, 81, 824, 67, 74, 856
See application file for complete search history.

(56) References Cited

U.S. PATENT DOCUMENTS

| 4,050,756 | A | * | 9/1977 | Moore | .................. G04G 17/06 |
| | | | | | 174/254 |
| 4,229,061 | A | * | 10/1980 | Majors | ............... H01R 13/2421 |
| | | | | | 439/217 |
| 4,240,198 | A | * | 12/1980 | Alonso | .............. H01R 13/2414 |
| | | | | | 29/876 |
| 4,705,205 | A | * | 11/1987 | Allen | ....................... B23K 3/06 |
| | | | | | 228/180.22 |
| 4,751,563 | A | * | 6/1988 | Laibowitz | ........... H01L 21/4846 |
| | | | | | 257/34 |

(Continued)

FOREIGN PATENT DOCUMENTS

JP 2003-520454 A 7/2003

OTHER PUBLICATIONS

International Search Report and Written Opinion issued in PCT Application No. PCT/US2016/063385, dated Mar. 13, 2017, 12 pages.

*Primary Examiner* — Alexander Gilman
(74) *Attorney, Agent, or Firm* — Grossman, Tucker, Perreault & Pfleger, PLLC

(57) ABSTRACT

An electronic device connection system includes a first electrical device and a second electrical device. The first electrical device includes a plurality of electrical connectors disposed in, on, or about at least a portion of an exterior surface of the first electrical device. The second electrical device includes a plurality of electrical contacts disposed in, on, or about at least a portion of an exterior surface of the second electrical device. A mechanical compressor exerts a force on at least one of the first electrical device or the second electrical device such that the electrical connections on the first electrical device physically and conductively couple to the electrical contacts on the second electrical device. The device casing may function as the mechanical compressor. The electrical connectors and/or electrical contacts may include injection molded connectors that include a conductive material dispersed in a thermoplastic matrix.

11 Claims, 12 Drawing Sheets

(56) References Cited

U.S. PATENT DOCUMENTS

| | | | | |
|---|---|---|---|---|
| 4,934,967 A * | 6/1990 | Marks | | H05K 7/1084 439/751 |
| 5,105,537 A * | 4/1992 | Datta | | H01R 13/22 205/667 |
| 5,118,299 A * | 6/1992 | Burns | | H01L 23/32 439/290 |
| 5,354,205 A * | 10/1994 | Feigenbaum | | G01R 1/073 205/78 |
| 5,531,021 A * | 7/1996 | Kolman | | H01L 21/486 228/180.21 |
| 5,640,052 A * | 6/1997 | Tsukamoto | | H01L 24/81 257/738 |
| 5,673,846 A * | 10/1997 | Gruber | | B23K 35/0222 164/113 |
| 5,738,530 A * | 4/1998 | Schreiber | | H01R 13/2414 439/66 |
| 5,899,757 A | 5/1999 | Neidich et al. | | |
| 6,908,347 B2 * | 6/2005 | Sasaki | | H01R 13/2421 439/66 |
| 6,948,946 B1 | 9/2005 | Ju | | |
| 7,083,436 B2 * | 8/2006 | Brodsky | | B29C 45/0013 257/E23.067 |
| 7,303,402 B2 * | 12/2007 | Takagi | | H05K 3/365 439/66 |
| 7,466,154 B2 * | 12/2008 | Brodsky | | H01R 13/2414 324/755.11 |
| 7,527,505 B2 * | 5/2009 | Murata | | G01R 1/06733 439/81 |
| 7,585,173 B2 * | 9/2009 | Hilty | | H01R 13/2414 439/66 |
| 8,179,692 B2 * | 5/2012 | Ihara | | H01L 24/13 257/696 |
| 8,851,904 B2 * | 10/2014 | Chang | | H01R 12/71 439/607.03 |
| 9,320,144 B2 * | 4/2016 | Rathbun | | H05K 1/141 |
| 2003/0003779 A1 | 1/2003 | Rathbun | | |
| 2007/0298624 A1 * | 12/2007 | Hougham | | H05K 3/326 439/66 |
| 2009/0029568 A1 | 1/2009 | Ju | | |
| 2012/0003846 A1 * | 1/2012 | Wertz | | H01R 12/718 439/65 |

* cited by examiner

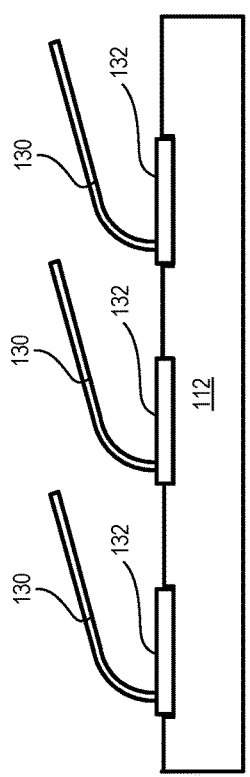
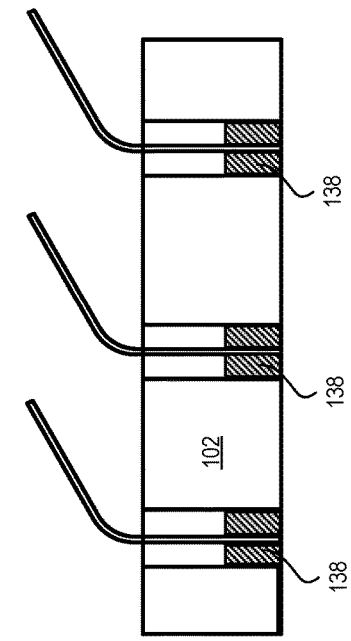
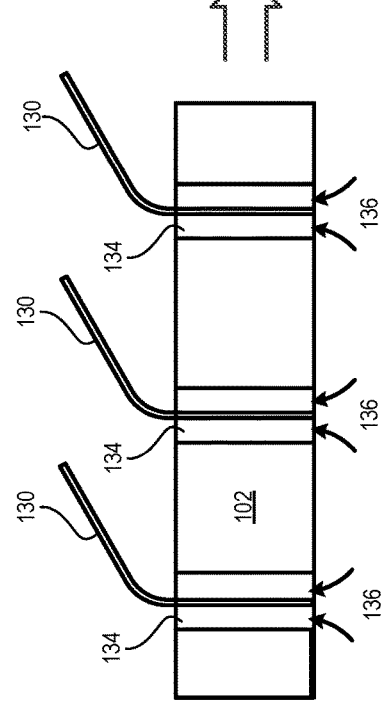

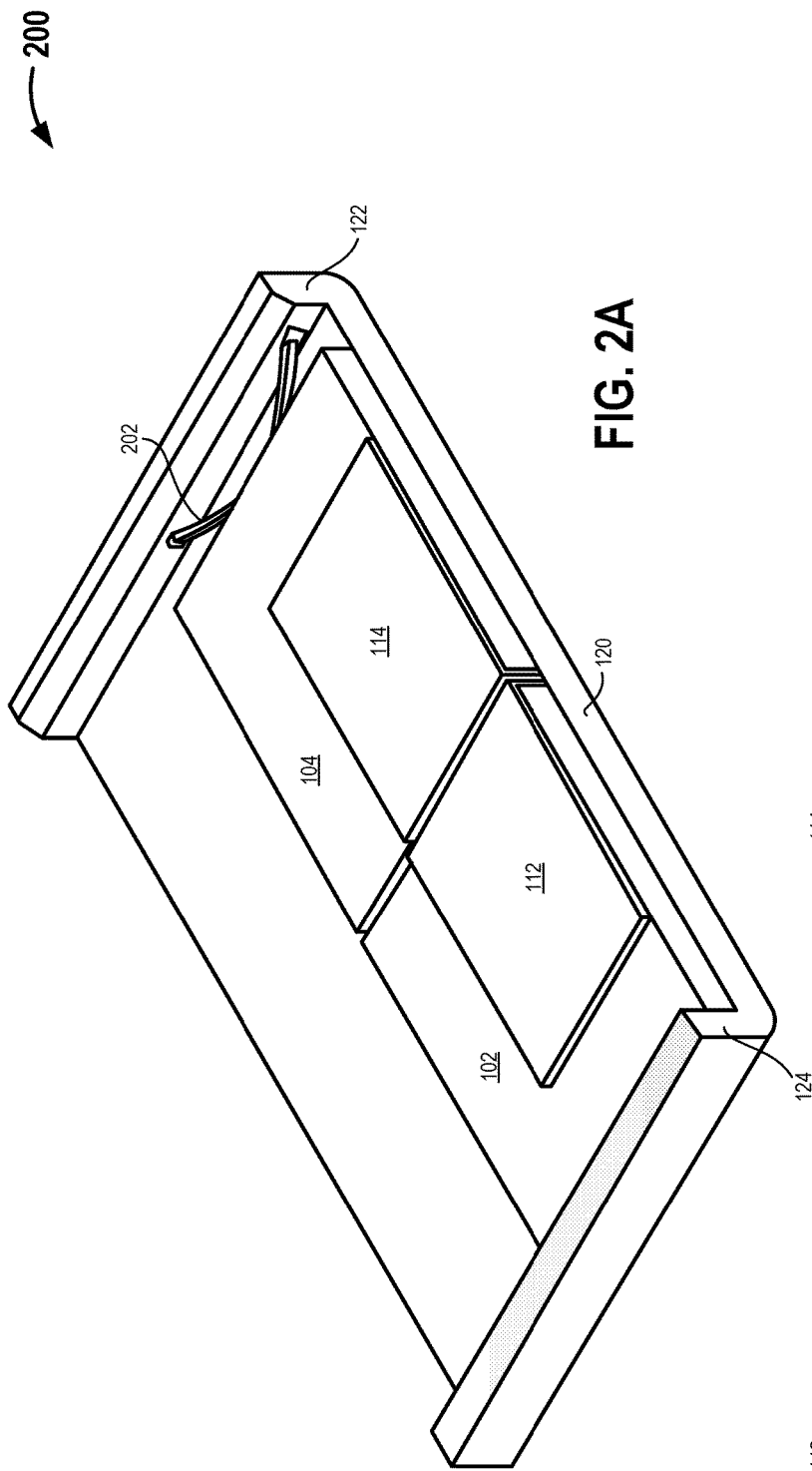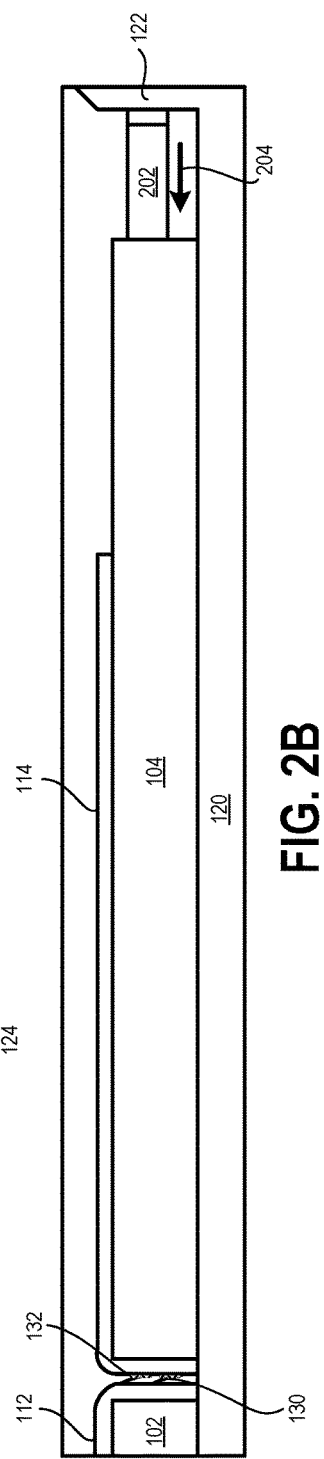
FIG. 2A
FIG. 2B

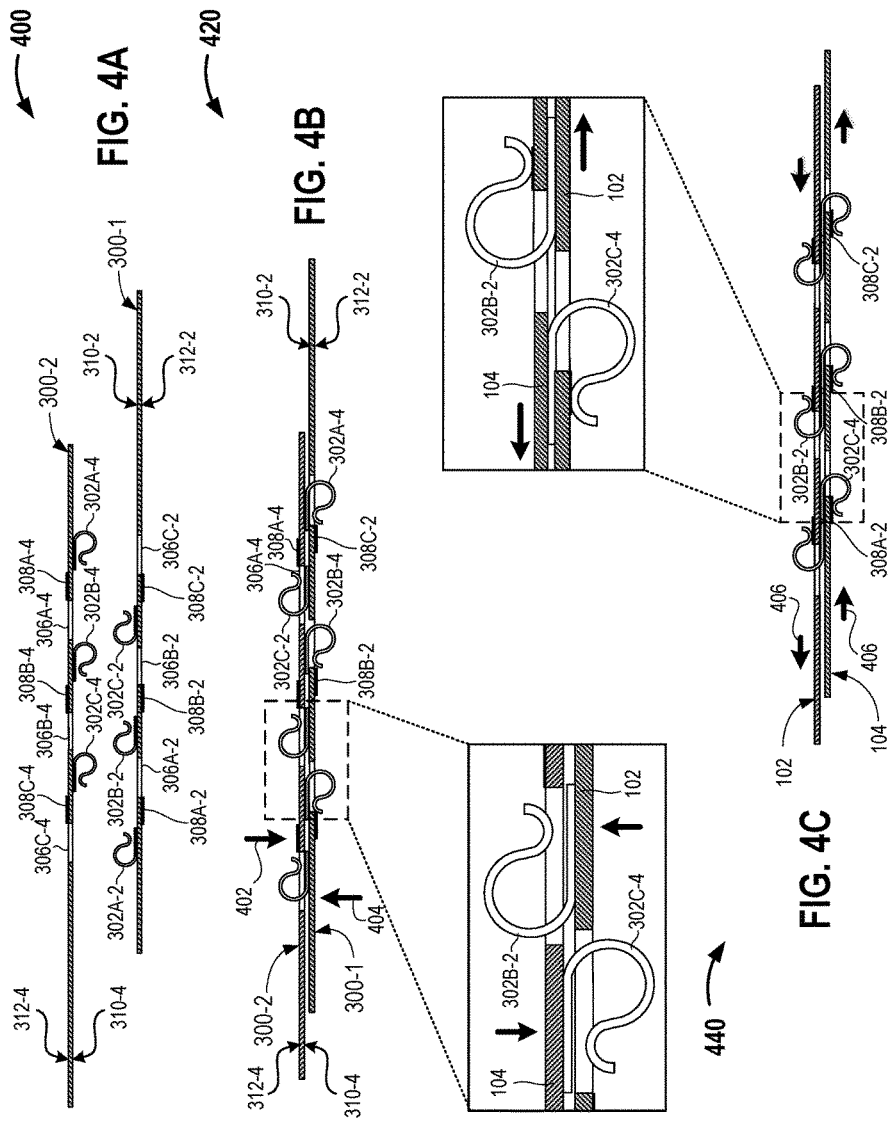

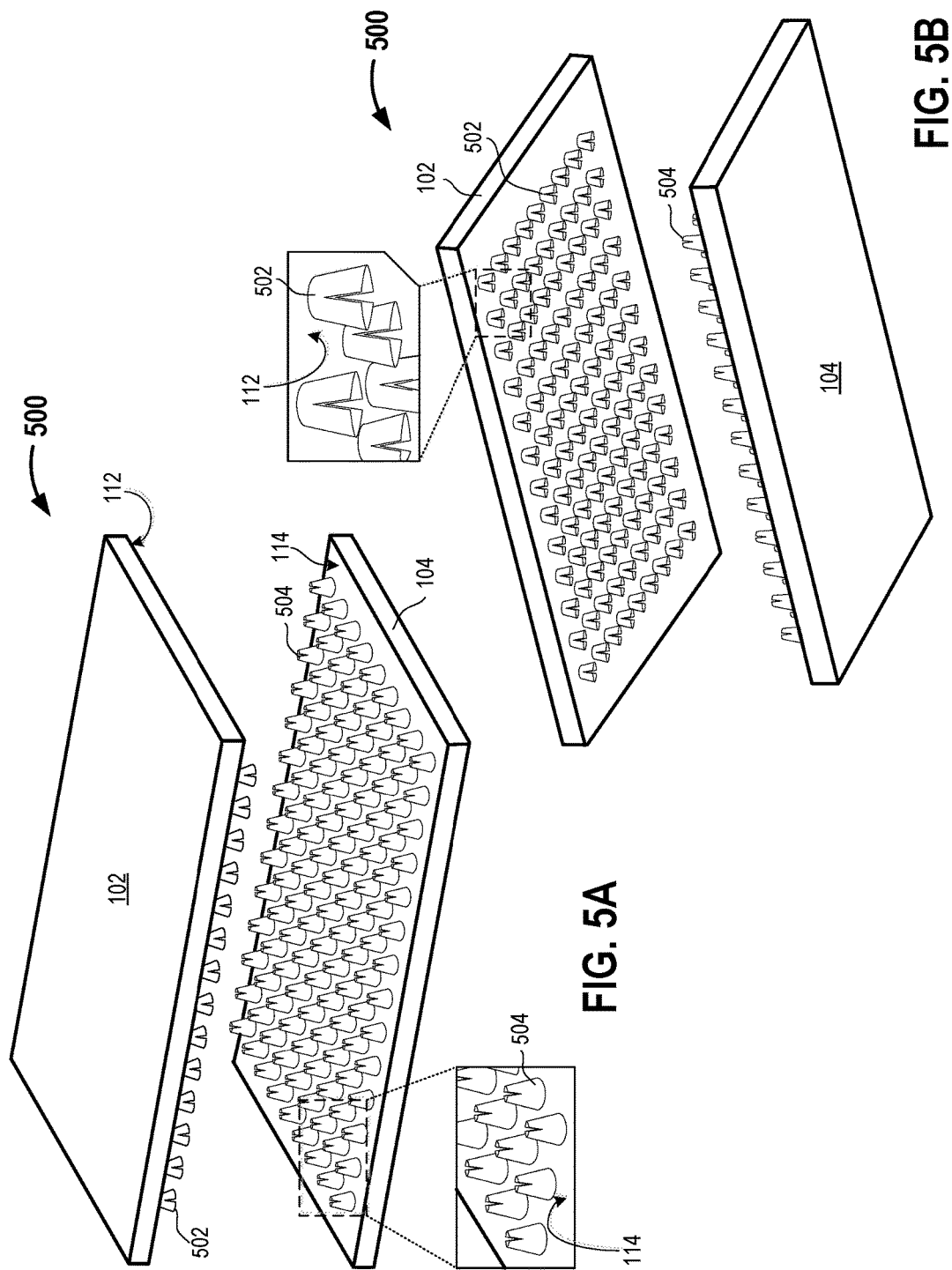

SMALL FORM FACTOR SOCKETS AND CONNECTORS

TECHNICAL FIELD

The present disclosure relates to electrical coupling systems for electronic devices such as integrated circuits.

BACKGROUND

In typical small form factor devices such as smartphones and tablets, assembly often includes multiple sub-systems and/or modules such as a computing/storage sub-system or module, a wireless communication sub-system or module, a sensor sub-system or module, a battery and power management sub-system or module, and a display sub-system or module. These sub-systems or modules are conductively and communicably coupled using mechanical connectors such as board-to-board (B2B) and/or flexible printed circuit (FPC) connectors. As exemplified by the growth in wearable devices and the Internet of things (IoT), growing preference for smaller device size exists within the marketplace. Thus, there is a growing need to scale connectors to achieve smaller pitch and greater contact counts. However, the demand for such connectors is not limited to small form factor devices since the same type of high density, flexible, interconnect may be used in larger server/communication chips, such as System in Package (SIP) devices. There is an increasing demand for physically positioning board level devices proximate to accommodate increasing digital data transfer rates. There is a need for a high-density interconnect that simplifies the development and fabrication of stacked or folded multiple chip modules within smaller form factor devices, such as portable electronic devices, smartphones, wearables, and internet of things.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

FIG. 1C is a side elevation of an example electrical connector conductively coupled to an electrical contact pad on a first flexible circuit, in accordance with at least one embodiment of the present disclosure;

FIG. 1D is a side elevation of another example electrically conductive member disposed in an aperture in an exterior surface of a first electrical device, in accordance with at least one embodiment of the present disclosure;

FIG. 1E is a side elevation of the example electrically conductive member depicted in FIG. 1E with the aperture in the exterior surface of the first electrical device at least partially filled with solder, in accordance with at least one embodiment of the present disclosure;

FIG. 2A is a perspective view of another example system 200 in which a number of surface features including an upturned device casing and a mechanical compressor in the form of a spring tensioner are used to maintain an electrical coupling between a first flexible circuit coupled to the first electrical device and a second flexible circuit coupled to the second electrical device, in accordance with at least one embodiment of the present disclosure;

FIG. 2B is a partial cross-sectional view of the system depicted in FIG. 2A, in accordance with at least one embodiment of the present disclosure;

FIG. 4A is a cross sectional view of a system that includes a first electrical device and a second electrical device, such as depicted in FIG. 3, positioned in a first surface-to-first surface (i.e., a face-to-face) arrangement, in accordance with at least one embodiment of the present disclosure;

FIG. 4B is a cross sectional view of a system in which the first electrical device and the second electrical device positioned such that the tensioned electrical connectors on the first electrical device pass through apertures on the second electrical device and the tensioned electrical connectors on the second electrical device pass through apertures on the first electrical device, in accordance with at least one embodiment of the present disclosure;

FIG. 4C is a cross sectional view of a system in which the tensioned electrical connectors on the second electrical device have been laterally displaced to provide an electrical coupling to the electrical contacts on the first electrical device and the tensioned electrical connectors on the first electrical device have been laterally displaced to provide an electrical coupling to the electrical contacts on the second electrical device, in accordance with at least one embodiment of the present disclosure;

FIG. 5A is a downward-looking perspective view of another system in which the mechanical compressor includes a plurality of tensioned electrical connectors disposed across an upper surface of the first electrical device and a corresponding plurality of complimentary tensioned electrical connectors disposed across a lower surface of the second electrical device, in accordance with at least one embodiment of the present disclosure;

FIG. 5B is an upward-looking perspective view of the system depicted in FIG. 5A that more clearly depicts the tensioned electrical connectors disposed on the lower surface of the first electronic device, in accordance with at least one embodiment of the present disclosure;

Figure 1A:
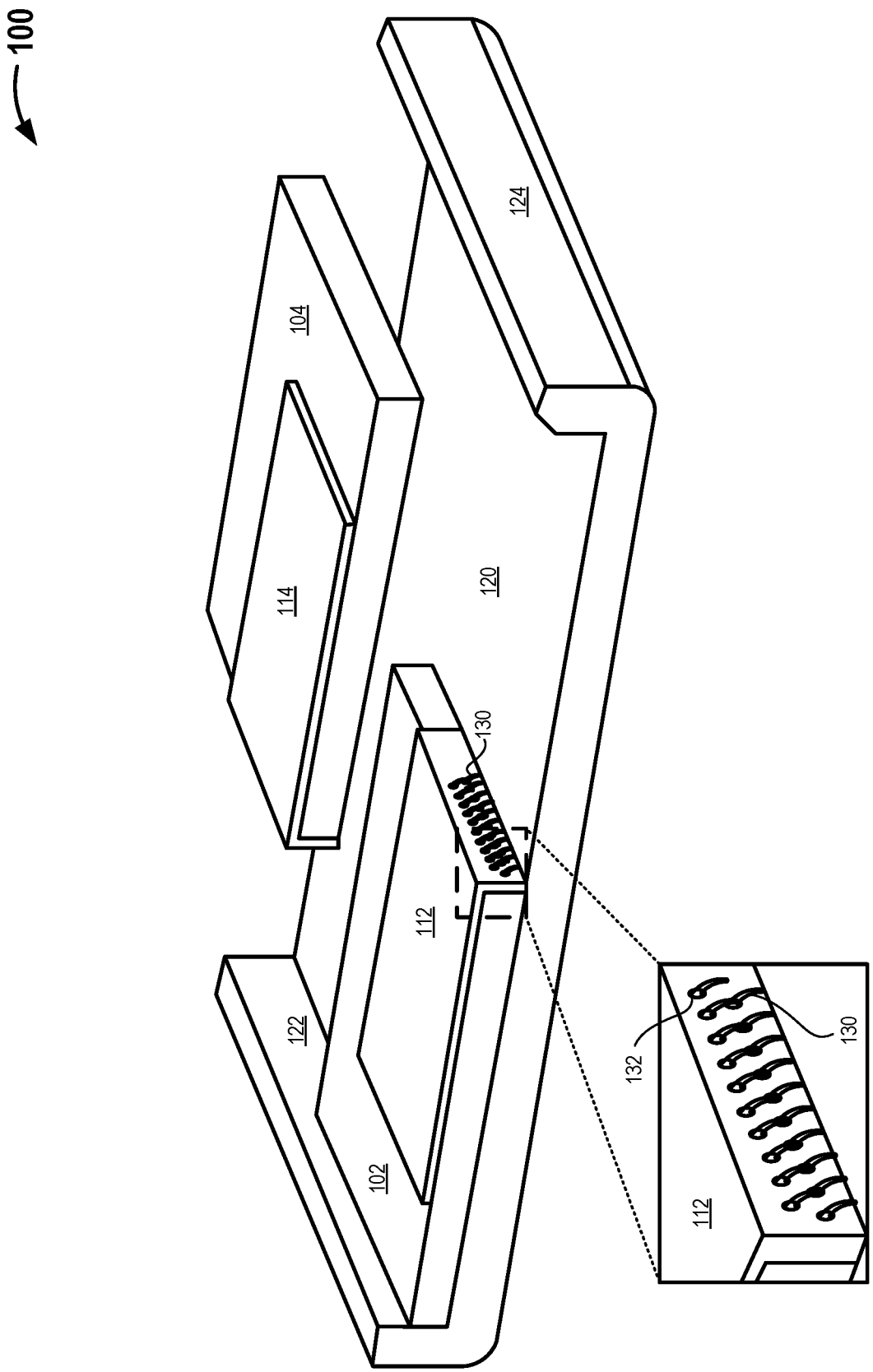
FIG. 1A is a perspective view of an example system in which at least a portion of a device housing provides the mechanical compressor that causes a first electrical device to electrically conductively couple to a second electrical device, in accordance with at least one embodiment of the present disclosure.

Although the following Detailed Description will proceed with reference being made to illustrative embodiments, many alternatives, modifications and variations thereof will be apparent to those skilled in the art.

DETAILED DESCRIPTION

The systems and methods described herein include assembly implementations and contact designs on substrates or flex circuits that provide low profile configurations useful in all electronic devices, and particularly useful in small form factor electronic devices. One example implementations includes a number of electrical connections or contacts on a substrate such as a flex circuit that conductively couple to corresponding electrical connections or contacts on a second substrate through the application of mechanical compression (i.e., pressure) provided by a surrounding device housing, chassis, or casing. Example electrical contacts useful in such an implementation include, but are not limited to stamped metal cantilever type connectors, split ring connectors, and conductive polymer filled elastomer connectors injection molded to a substrate. Other example electrical contacts useful in such an implementation includes electrical contacts and metal pads on both top and bottom surfaces of one substrate in an interleaving array style mate with the metal pads and contacts of another similar substrate.

Low profile implementation of contacts on substrates may advantageously drive down overall dimensions of the small form factor electronic device, particularly when compared to existing B2B and FPC connector solutions. The systems and methods described herein may beneficially circumvent system assembly complexity as electrical connections are established in a self-contained system without the use of excessive enabling hardware. The systems and methods described herein further advantageously improve thermo-mechanical reliability when compared to competing technologies such as wire-bonding. The advantages of the systems and methods described herein may be advantageously deployed in a broad range of products and applications where electrical connections between integrated circuits and modules such as processors, wireless radio, memory, sensors, battery, and antennas in SiPs.

An electronic apparatus is provided. The electronic apparatus may include a first electronic device that includes at least one electrical connector disposed on an exterior surface of the first electronic device. The apparatus may further include a second electronic device that includes at least one electrical contact disposed on an exterior surface of the second electronic device. The apparatus may also include a mechanical compressor, wherein the mechanical compressor applies a compressive force to the first electronic device and to the second electronic device such that the electrical connector on the first electronic device is maintained in physical and electrical contact with the electrical contact on a second electronic device.

An electronic device coupling system is provided. The electronic device coupling system may include a first electronic device and a second electronic device. Both the first electronic device and the second electronic device may include a member having a plurality of electrical connectors disposed on a first surface and a corresponding plurality of electrical contacts disposed on a second surface opposed to the first surface, each of the electrical contacts disposed proximate one of a corresponding plurality of apertures extending through the member from the first surface to the second surface. The electrical connectors on the first electronic device pass through the apertures on the second electronic device and contact the electrical contacts on the second electronic device; and the electrical connectors on the second electronic device contemporaneously pass through the apertures on the first electronic device and contact the electrical contacts on the first electronic device.

A method of conductively coupling a first electronic device to a second electronic device is provided. The method may include disposing a plurality of electrical connectors on an exterior surface of the first electronic device, disposing a plurality of electrical contacts on an exterior surface of the second electronic device, and applying a compressive force to the first electronic device and the second electronic device such that each of electrical connectors on the exterior surface of the first electronic device physically and electrically couple to a respective one of the electrical contacts on the exterior surface of the second electronic device.

A system for conductively coupling a first electronic device to a second electronic device is provided. The system may include a means for disposing a plurality of electrical connectors on an exterior surface of the first electronic device, a means for disposing a plurality of electrical contacts on an exterior surface of the second electronic device, and a means for applying a compressive force to the first electronic device and the second electronic device such that each of electrical connectors on the exterior surface of the first electronic device physically and electrically couple to a respective one of the electrical contacts on the exterior surface of the second electronic device.

As used herein, the terms "top," "bottom," "upper," and "lower" are intended to provide a relative and not an absolute reference to a location. Thus, inverting an object described as having a "top portion" and a "bottom portion" may place the "bottom portion" on the top of the object and the "top portion" on the bottom of the object. Such configurations should be considered as included within the scope of this disclosure.

As used herein, the terms "first," "second," and other similar ordinals are intended to distinguish a number of similar or identical objects and not to denote a particular or absolute order of the objects. Thus, a "first object" and a "second object" may appear in any order—including an order in which the second object appears before or prior in space or time to the first object. Such configurations should be considered as included within the scope of this disclosure.

Figure 1B:
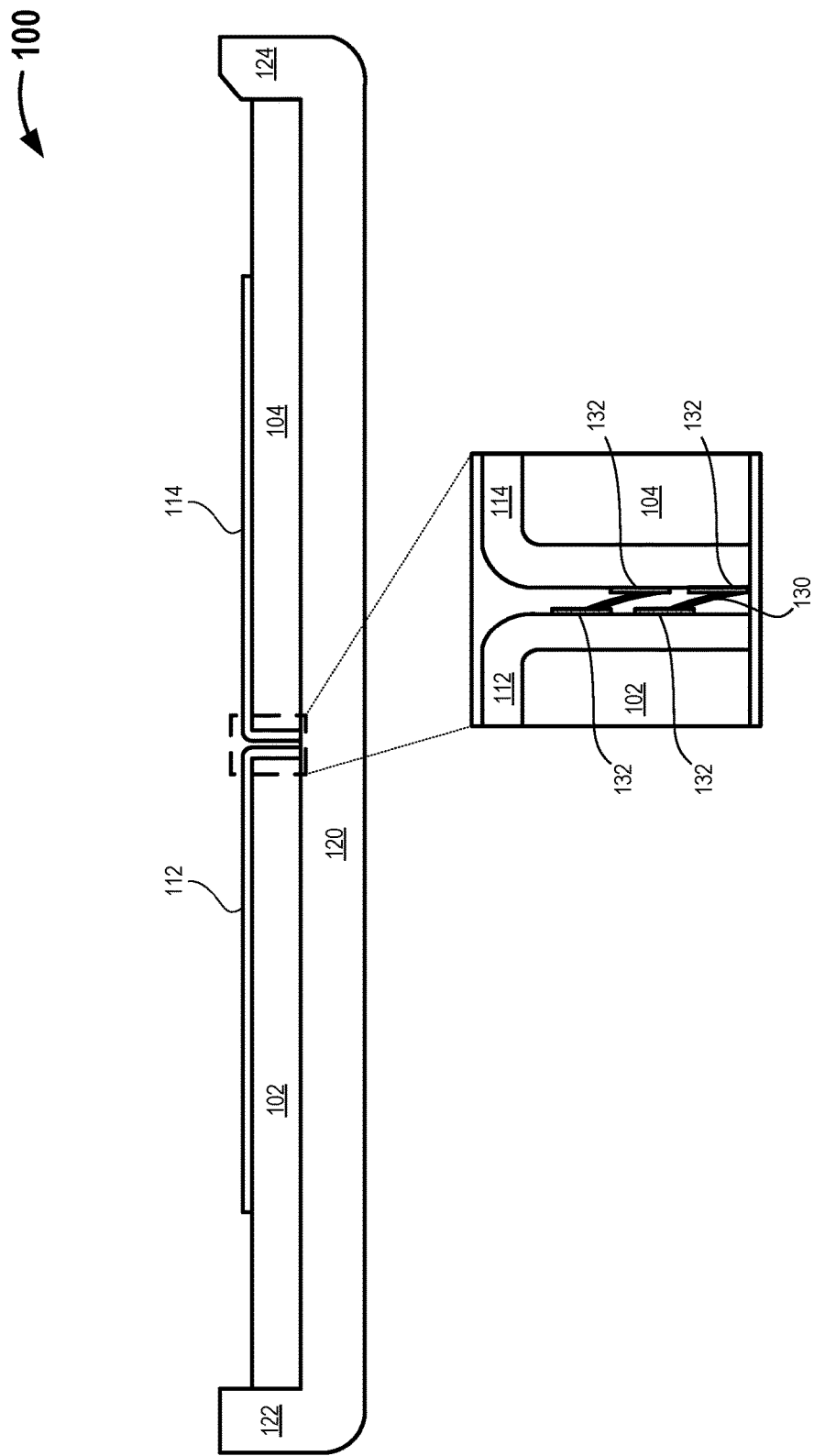
FIG. 1B is a side elevation of the example system depicted in FIG. 1A with an inset enlarged view of a first type of electrical connection that electrically conductively couples the first electrical device to the second electrical device, in accordance with at least one embodiment of the present disclosure.

FIG. 1A is a perspective view of an example system 100 in which at least a portion of a device housing 120 provides a mechanical compressor that causes a physical and electrical coupling of a first electrical device 102 with a second electrical device 104, in accordance with at least one embodiment of the present disclosure. FIG. 1B is a side elevation of the example system 100 depicted in FIG. 1A with an inset enlarged view of a first type of electrical connection that conductively couples a first electrical device 102 to a second electrical device 104, in accordance with at least one embodiment of the present disclosure. The first electrical device 102 and the second electrical device 104 are disposed at least partially within a device casing, housing, chassis, frame, or similar member demonstrating adequate stiffness or rigidity. In embodiments, adequate stiffness or rigidity may include a level of mechanical stiffness or rigidity that is sufficient to maintain the first electrical device 102 and the second electrical device 104 in a static contact with each other using the compressive force applied to the first electrical device 102 by a first upturned portion 122 and applied to the second electrical device 104 by a second upturned portion 124 of the device housing 120. In such an implementation, a number of electrical connections 130 conductively coupled to the first electrical device 102 and a number of electrical connection conductively coupled to the second electrical device 104 (not visible in FIGS. 1A,1B) may be maintained physically proximate and in a conductively coupled state.

The first electrical device 102 may include any number and/or combination of any current and/or future developed devices and/or systems that include one or more electrical circuits, configurable electrical circuits, logic gates, electrical components, and/or semiconductor devices. In some implementations, the first electrical device may include one or more integrated circuits that may or may not be disposed in external packaging. Non-limiting example first electrical devices 102 may include, but are not limited to, one or more processors, one or more microprocessors, one or more sensors, one or more wireless communication interfaces, one or more power supplies/power regulators/power converters, one or more data storage devices, one or more antennas. In some implementations, the first electrical device 102 may include one or more current or future developed application specific integrated circuits (ASICs), reduced instruction set computers (RISCs), digital signal processors (DSPs), field programmable gate arrays (FPGAs), or similar. In some implementations, the first electrical device 102 may include a rigid substrate, housing, and/or package to provide a structurally rigid member.

The second electrical device 104 may include any number and/or combination of any current and/or future developed devices and/or systems that include one or more electrical circuits, configurable electrical circuits, logic gates, electrical components, and/or semiconductor devices. In some implementations, the first electrical device may include one or more integrated circuits that may or may not be disposed in external packaging. Non-limiting example second electrical devices 104 may include, but are not limited to, one or more processors, one or more microprocessors, one or more sensors, one or more wireless communication interfaces, one or more power supplies/power regulators/power converters, one or more data storage devices, one or more antennas. In some implementations, the second electrical device 104 may include one or more current or future developed application specific integrated circuits (ASICs), reduced instruction set computers (RISCs), digital signal processors (DSPs), field programmable gate arrays (FPGAs), or similar. In some implementations, the second electrical device 104 may include a rigid substrate, housing, and/or package to provide a structurally rigid member.

One or more flexible substrates and/or circuits 112 (generally "flexible circuits 112" and/or "one or more flexible circuits 112") may be disposed proximate the first electrical device 102. The one or more flexible circuits 112 may include a number of electrically conductive connectors 130 that may take the form of projecting members (as depicted in FIGS. 1A and 1B), electrical contact pads, or any other similar electrically conductive device, fixture, or structure that is conductively coupled to the first electrical device 102. In some implementations, the one or more flexible circuits 112 may conductively couple a plurality of electrical connectors 130 to a corresponding number of electrical devices, contacts, contact points or combinations thereof that are disposed in, on, or about the first electrical device 102. In some implementations, some or all of the electrical connectors 130 may be physically and/or conductively coupled to electrical pads or similar devices disposed on at least a portion of the exterior surface of the first electrical device.

Referring now to FIG. 1C, a number of electrical conductors 130 conductively coupled to a flexible circuit 112. Each of the electrical conductors 130 is physically and conductively coupled to an electrical contact pad 132. In some implementations, the electrical contact pad 132 may be wholly or partially embedded within the flexible circuit 112, for example partially embedded in a flexible substrate that includes photolithographed conductive traces that conductively couple to various devices, contacts, or contact points in, on, or about the first electrical device. It should be understood that while FIG. 1C is described in relation to the first electrical device 102 and the corresponding flex circuit 112, the principles and structures described above are equally applicable to the second electrical device 104 and the corresponding flex circuit 114 and should be considered as falling within the scope of this disclosure.

Referring now to FIG. 1D and FIG. 1E-FIG. 1D depicts a number of electrical conductors 130 disposed in apertures 134 in a wall, structure, or package disposed at least partially about the first electrical device 102. Solder 136 may be flowed into at least a portion of each aperture 134 to physically bond the electrical conductor to the first electrical device 102. FIG. 1E depicts a number of electrical conductors 130 physically coupled to the wall, structure, or package disposed at least partially about the first electrical device 102. In FIG. 1E, solder 138 has flowed into and at least partially filled the aperture 134. It should be understood that while FIGS. 1D and 1E are described in relation to the first electrical device 102, the principles and structures described above are equally applicable to the second electrical device 104 and should be considered as falling within the scope of this disclosure.

Returning now to FIGS. 1A and 1B, one or more flexible substrates and/or circuits 114 (generally "flexible circuit 114" and/or "one or more flexible circuits 114") may be disposed proximate the second electrical device 104. The flexible circuits 114 may include a number of electrically conductive connectors 130 that may take the form of any number and/or combination of projecting members, electrical contact pads, or any other similar electrically conductive device, fixture, or structure that is conductively coupled to the second electrical device 104. In one or more implementations, such as depicted in FIG. 1B, the flexible circuit 114 may include a plurality of electrical contact pads 132 that are disposed in, on, or about the flexible circuit 114. In some implementations, the one or more flexible circuits 114 may conductively couple a plurality of electrical connectors, such as a plurality of electrical contact pads 132, to a corresponding number of electrical devices, contacts, contact points or combinations thereof that are disposed in, on, or about the second electrical device 104.

As depicted in FIGS. 1A-1E, in embodiments, electrically conductive and physical contact between the first electrical device 102 and the second electrical device 104 may be maintained by a mechanical compressor exerting a force that pushes or otherwise compresses electrical conductors 130 on at least a portion of the exterior surface of the first electrical device 102 against electrical conductors 130 on at least a portion of the exterior surface of the second electrical device 104. In embodiments, for example the embodiment depicted in FIGS. 1A and 1B, electrically conductive and physical contact between the flexible circuit 112 coupled to the first electrical device 102 and the flexible circuit 114 coupled to the second electrical device 104 may be maintained by a mechanical compressor exerting a force that pushes or otherwise compresses electrical conductors 130 on at least a portion of the exterior surface of the first electrical device 102 against electrical conductors 130 on at least a portion of the exterior surface of the second electrical device 104.

As depicted in FIGS. 1A and 1B, the device casing, housing, or chassis may function as a mechanical compressor. In such embodiments, a first portion 122 of the device casing 120 may be disposed proximate the first electrical device 102 and may exert a force directed inward (i.e., toward the center of the casing) on the first electrical device 102. Further, a second portion 124 of the device casing 120 may be disposed proximate the second electrical device 104 and may also exert a force directed inward (i.e., toward the center of the casing) on the second electrical device 104. These inwardly directed forces may compress the electrical conductors 130 on the first electrical device 102 against the electrical pads 132 on the second electrical device 134, thereby maintaining physical and electrically conductive contact between the first electrical device 102 and the second electrical device 104.

The device casing 120 may include any number and/or combination of current and/or future developed systems and/or devices capable of at least partially accommodating at least the first electrical device 102 and the second electrical device 104. In some implementations, an upturned first portion 122 of the device casing 120 may be disposed proximate at least a portion of an exterior or external surface of the first electrical device 102 and may transfer a force to the first electrical device 102. At least a portion of the force exerted by the upturned first portion 122 of the device casing 120 may be directed toward the second electrical device 104. In some implementations, an upturned second portion 124 of the device casing 120 may be disposed proximate at least a portion of an exterior or external surface of the second electrical device 104 and may transfer a force to the second electrical device 104. At least a portion of the force exerted by the upturned second portion 124 of the device casing 120 may be directed toward the first electrical device 102.

In some implementations, all or a portion of the device casing 120 may be fabricated using one or more metals or metal alloys that provide sufficient elasticity to permit the insertion of the first electrical device 102 and the second electrical device 104 and sufficient rigidity to maintain the contact between the first electrical device 102 and the second electrical device 104. For example, aluminum or an aluminum alloy. In some implementations, all or a portion of the device casing 120 may be fabricated using one or more non-metallic materials that provide sufficient elasticity to permit the insertion of the first electrical device 102 and the second electrical device 104 and sufficient rigidity to maintain the contact between the first electrical device 102 and the second electrical device 104. For example, carbon fiber.

Figure 1F:
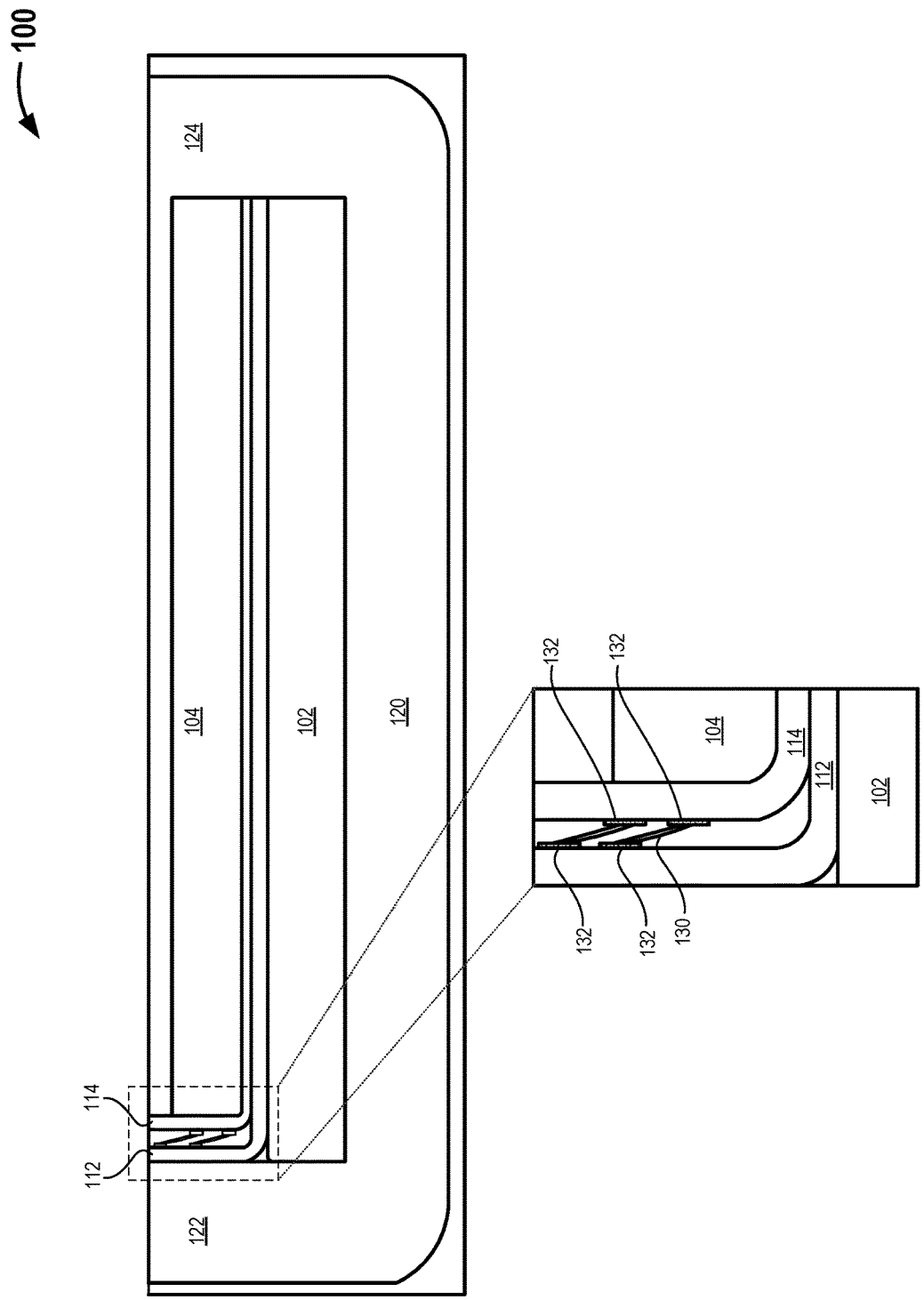
FIG. 1F is a side elevation of another example system 100 that includes a second electrical device stacked on an example first electrical device in which a first flexible circuit coupled to the first electrical device electrically couples to a second flexible circuit coupled to the second electrical device, in accordance with at least one embodiment of the present disclosure.

FIG. 1F depicts an alternate arrangement in which the second electrical device 104 is stacked on top of the first electrical device 102, in accordance with one or more embodiments described herein. As depicted in FIG. 1F, the flexible circuit 112 coupled to the first electrical device 102 may be upturned and disposed between a first upturned portion 122 of the device casing 120 and the flexible circuit 114 coupled to the second electrical device 104. In such an implementation, the first upturned portion 122 of the device casing 120 may direct an inward force on the upturned portion of the flexible circuit 112 that physically and conductively couples the electrical connection 130 on the flexible circuit 112 to the electrical contact pads 132 on the flexible circuit 114.

FIG. 2A is a perspective view of a system 200 in which a first electrical device 102 is physically and electrically coupled to a second electrical device 104 by a mechanical compressor, in accordance with at least one embodiment of the present disclosure. FIG. 2B is a partial cross-sectional view of the example system 200 depicted in FIG. 2A, in accordance with at least one embodiment of the present disclosure. In some implementations, a plurality of electrical connectors 130 on the first electrical device 102 and a plurality of electrical contacts 132 on the second electrical device may be maintained physically proximate and conductively coupled via one or more surface features disposed within at least a portion of the device casing 120.

In embodiments, the one or more surface features may include one or more devices, systems, or combinations thereof that are at least partially disposed within the device casing 120. In some implementations, the one or more surface features may be affixed to or formed with the device casing 120, such as the upturned portion 124 of the device casing as depicted in FIG. 2A. In some implementations, the one or more surface features may include one or more devices, systems, or combinations thereof that are capable of providing a force that maintains the physical and/or electrical contact between the first electrical device 102 and the second electrical device 104. For example, as depicted in FIGS. 2A and 2B, the one or more surface features may include one or more mechanical compressors such as a compressed coil or leaf spring 202. In such embodiments, the compressed spring 202 provides a force against the second electrical device 104 that causes the plurality of electrical connectors 130 on the first electrical device 102 to physically contact and electrically couple to the plurality of electrical contacts 132 on the second electrical device 104. In some embodiments, the one or more surface features may include one or more protrusions, detents, or similar surface features formed integral with the device casing 120.

Figure 3:
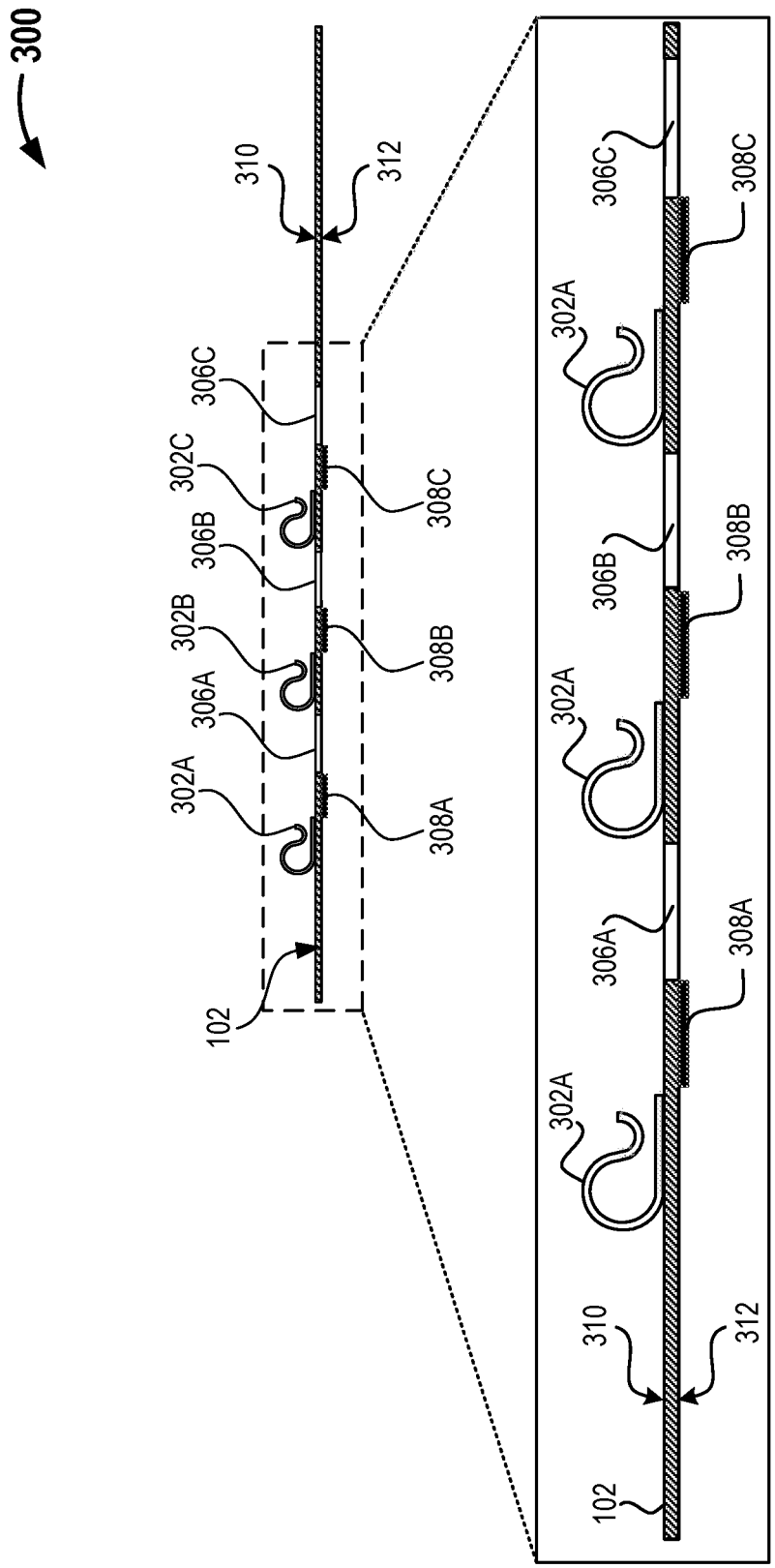
FIG. 3 is a side elevation of another example system in which a number of tensioned electrical connectors are disposed on an upper surface of a first electrical device, in accordance with at least one embodiment of the present disclosure.

FIG. 3 is a side elevation of a system 300 that includes a plurality of tensioned electrical connectors 302A-302n (collectively, "tensioned electrical connectors 302") physically and/or electrically coupled to a first electrical device 102 that includes that provide a mechanical force directed towards a substrate 304 to which the tensioned electrical connectors 302 are physically and electrically coupled, in accordance with at least one embodiment of the present disclosure. As depicted in FIG. 3, the plurality of tensioned electrical connectors 302 may generate sufficient mechanical force to provide a mechanical compressor capable of physically and conductively coupling the first electrical device 102 to another similar electrical device having comparable tensioned electrical connectors 302.

The first electrical device 102 may further include a plurality of electrical contacts 308A-308n (collectively, "electrical contacts 308") disposed on a second surface of the substrate 304. In some implementations, the number of tensioned electrical connectors 302 included in the plurality of tensioned electrical connectors may be the same as the number of electrical contacts 308 included in the plurality of electrical contacts. In other implementations, the number of tensioned electrical connectors 302 included in the plurality of tensioned electrical connectors may be different than the number of electrical contacts 308 included in the plurality of electrical contacts.

In embodiments, the first surface of the substrate 304 may be disposed laterally opposite the second surface of the substrate 304, thereby forming an approximately planar structure. In some implementations, all or a portion of the substrate 304 may provide a rigid planar structure. In other implementations, all or a portion of the substrate 304 may provide a flexible planar structure. Where the substrate 304 includes a flexible planar structure, the first electrical device 102 may be formed in shapes that include curves and/or bends.

A plurality of apertures 306A-306n (collectively, "apertures 306") may penetrate from the first side of the substrate 304 to the second side of the substrate 304. In embodiments, the number of apertures 306 may be equal to or greater than the number of electrical connectors 302 included in the plurality of electrical connectors. In embodiments, each of at least a portion of the apertures 306 may be disposed proximate a respective tensioned electrical connector 302 on the first side of the substrate 304 and proximate a respective electrical contact 308 on the second side of the substrate 304.

Each tensioned electrical connector 302 may include one or more conductive materials formed in any shape or configuration capable of providing a mechanical compressor capable of generating a downward force directed toward the substrate 304 to which the tensioned electrical connectors 302 are physically coupled. The "shepherd's crook" configuration depicted in FIG. 3 is a non-limiting example of an illustrative tensioned electrical connector 302. In implementations, each tensioned electrical connector 302 may be conductively coupled to one or more circuits, electrical components, and/or semiconductor devices disposed in on, or about the first electrical device 102. In implementations, each electrical contact 308 may be conductively coupled to one or more circuits, electrical components, and/or semiconductor devices disposed in on, or about the first electrical device 102.

FIG. 4A is a cross sectional view of a system 400 that includes a first electrical device 102 and a second electrical device 104 positioned in a face-to-face arrangement in which a first surface 310-2 of the first electrical device is arranged in a face-to-face configuration with the first surface 310-4 of the second electrical device 104, in accordance with at least one embodiment of the present disclosure. In such an arrangement, the tensioned electrical connectors 302 on both the first electrical device 102 and the second electrical device 104 may generate sufficient mechanical force to act as the mechanical compressor, physically and electrically conductively coupling the first electrical device 102 to the second electrical device 104.

In embodiments, such as depicted in FIG. 4A, the second electrical device 104 may simply be an inverted first electrical device 102. At least a portion of the plurality of tensioned electrical connectors 302A-2 to 302C-2 (collectively "tensioned electrical connectors 302-2") coupled to the first electrical device 102 may align or coincide with at least a portion of the plurality of apertures 306A-4 to 306C-4 (collectively "apertures 306-4") in the second electrical device 104. Similarly, at least a portion of the plurality of tensioned electrical connectors 302A-4 to 302C-4 (collectively "tensioned electrical connectors 302-4") coupled to the second electrical device 104 may align or otherwise coincide with at least a portion of the plurality of apertures 306A-2 to 306C-2 (collectively "apertures 306-2") in the first electrical device 102.

FIG. 4B is a cross sectional view of a system 420 in which a downward force 402 is applied to the second electrical device 104 and an upward force 404 is applied to the first electrical device 102 such that the first surface 310-4 of the second electrical device 104 is positioned proximate the first surface 310-2 of the first electrical device 102, in accordance with at least one embodiment of the present disclosure. In such a configuration, the tensioned electrical connectors 102-2 on the first electrical device 102 pass through apertures 306-4 on the second electrical device 104 and the tensioned electrical connectors 102-4 on the second electrical device 104 pass through the apertures 306-2 on the first electrical device 102.

FIG. 4C is a cross-sectional view of a system 440 in which the first electrical device 102 has been laterally displaced with respect to the second electrical device 104 such that each of at least some of the tensioned electrical connectors 302-2 on the first electrical device 102 contact the a respective electrical contact 308-4 on the second electrical device 104 and at least some of the tensioned electrical connectors 302-4 on the second electrical device 104 contact the a respective electrical contact 308-2 on the first electrical device 102, in accordance with at least one embodiment of the present disclosure.

As depicted in system 440, the tensioned electrical connectors 302 on both the first electrical device 102 and the second electrical device 104 function as mechanical compressors that physically and electrically conductively couple the electrical devices together. As depicted in FIG. 4C, the mechanical force generated by the electrical connectors 302 acting normally to the substrate 304 causes the mechanical compression of the first electrical device 102 against the second electrical device 104, and vice-versa.

After passing the electrical connectors 302 through corresponding apertures 306 on the opposing electrical device 102, 104, a lateral force 406 may be applied which causes each of at least some of the electrical connectors 302 to slide engage a respective one of the electrical contacts 308 on the opposing electrical device 102, 104. The downward force applied by each of the tensioned electrical connectors 302 causes the electrical devices 102 and 104 to press together, physically and electrically conductively coupling the electrical devices 102 and 104 together.

FIG. 5A is a downward-looking perspective view of an illustrative system 500 that includes an example first electrical device 102 that includes a number of hollow electrical connectors 502 and an example second electrical device 104 that includes a number of complimentary hollow electrical connectors 504, in accordance with at least one embodiment of the present disclosure. FIG. 5B is an upward-looking perspective view of the illustrative system 500 depicted in FIG. 5A that includes the example first electrical device 102 incorporating a number of hollow electrical connectors 502 and the example second electrical device 104 incorporating a number of complimentary hollow electrical connectors 504, in accordance with at least one embodiment of the present disclosure.

In some implementations, the first electrical device 102 may include any number of electrical connectors 502. Each of the electrical connectors 502 may be physically and electrically conductively coupled to one or more contacts, contact pads, or similar devices disposed in, on, or about the first electrical device 102. In some implementations, each of the electrical connectors 502 may be conductively coupled to one or more circuits that include any number or combination of electrical devices and/or semiconductor components. In some implementations, the one or more circuits may include, but are not limited to, one or more processor or controller circuits capable of executing machine-readable code and/or logic. In some implementations, the one or more circuits may include, but are not limited to, one or more storage devices capable of storing or otherwise retaining digital data or information.

In embodiments, each of the electrical connectors 502 may include a hollow or partially hollow electrically conductive member. In one or more embodiments, each of the electrical connectors 502 may include a hollow member having one of a number of geometric shapes, such as conical, hemispherical, trapezoidal, square, rectangular, blade-shaped, pyramidal, or a conical frustum. In some implementations, each of the electrical connectors 502 may include one or more grooves, slots, or similar openings to provide a tensioned electrical connector 502. In the embodiment depicted in FIGS. 5A and 5B, the electrical connectors 502 may include a conical frustum shaped hollow member having two opposed slots. As depicted in FIGS. 5A and 5B, the electrical connectors 502 may be physically coupled or affixed to the first electrical device 502 using the smaller of the two ends of the conical frustum shaped hollow member.

In some implementations, the second electrical device 104 may include any number of electrical connectors 504. Each of the electrical connectors 504 may be physically and electrically conductively coupled to one or more contacts, contact pads, or similar devices disposed in, on, or about the second electrical device 104. In some implementations, each of the electrical connectors 504 may be conductively coupled to one or more circuits that include any number or combination of electrical devices and/or semiconductor components. In some implementations, the one or more circuits may include, but are not limited to, one or more processor or controller circuits capable of executing machine-readable code and/or logic. In some implementations, the one or more circuits may include, but are not limited to, one or more storage devices capable of storing or otherwise retaining digital data or information.

In embodiments, each of the electrical connectors 504 may include a hollow or partially hollow electrically conductive member. In one or more embodiments, each of the electrical connectors 504 may include a hollow member having one of a number of geometric shapes, such as conical, hemispherical, trapezoidal, square, rectangular, blade-shaped, pyramidal, or a conical frustum. In some implementations, each of the electrical connectors 504 may include one or more grooves, slots, or similar openings to provide a tensioned electrical connector 504. In the embodiment depicted in FIGS. 5A and 5B, the electrical connectors 504 may include a conical frustum shaped hollow member having two opposed slots. As depicted in FIGS. 5A and 5B, the electrical connectors 504 may be physically coupled or affixed to the first electrical device 504 using the larger of the two ends of the conical frustum shaped hollow member. As depicted in FIGS. 5A and 5B, the electrical connector 504 may have a complimentary shape to the electrical connector 502, thereby permitting the partial or complete insertion of the electrical connector 504 into the hollow portion of electrical connector 502.

Figure 5C:
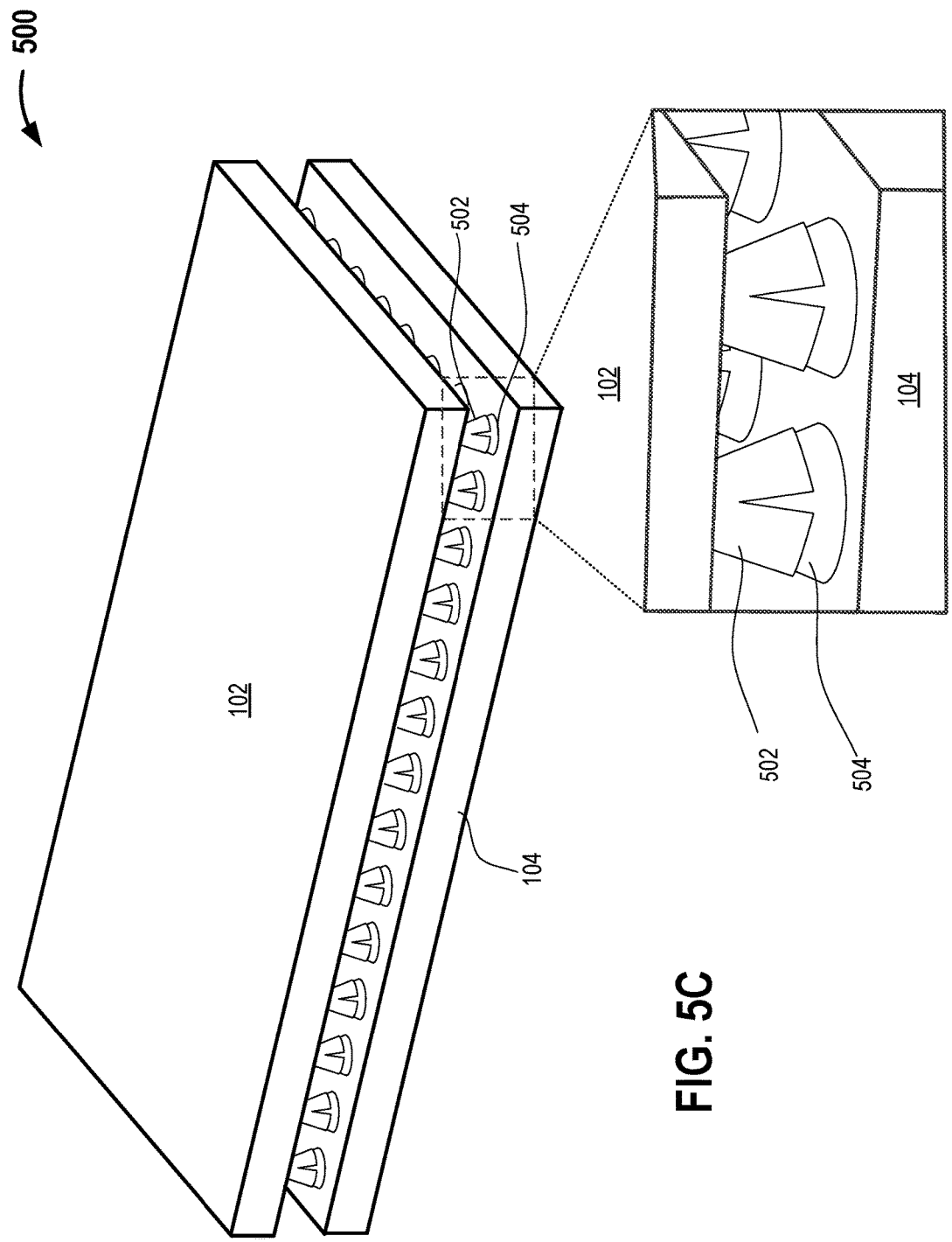
FIG. 5C is a downward-looking perspective view of the system depicted in FIGS. 5A and 5B in which the tensioned electrical connectors on the first electrical device engage the tensioned electrical connectors on the second electrical device, in accordance with at least one embodiment of the present disclosure.

FIG. 5C is a downward perspective view of the illustrative system 500 in which the example first electrical device 102 is physically and conductively coupled to the example second electrical device 104 via a mechanical compressor, in accordance with at least one embodiment of the present disclosure. As depicted in FIG. 5C, the electrical connectors 504 disposed on the second electrical device 104 have been at least partially inserted into the hollow portion of the electrical connectors 502 disposed on the first electrical device 102. In some implementations, the slots or similar tensioners in electrical connectors 502 and 504 may permit a friction fitting of the electrical connectors 502 to the electrical connectors 504. In some implementations, such friction fitting of the electrical connectors 502 and 504 may reduce or even eliminate the need to provide force from a mechanical compressor to maintain the physical and electrical coupling of the first electrical device 102 with the second electrical device 104.

Figure 6A:
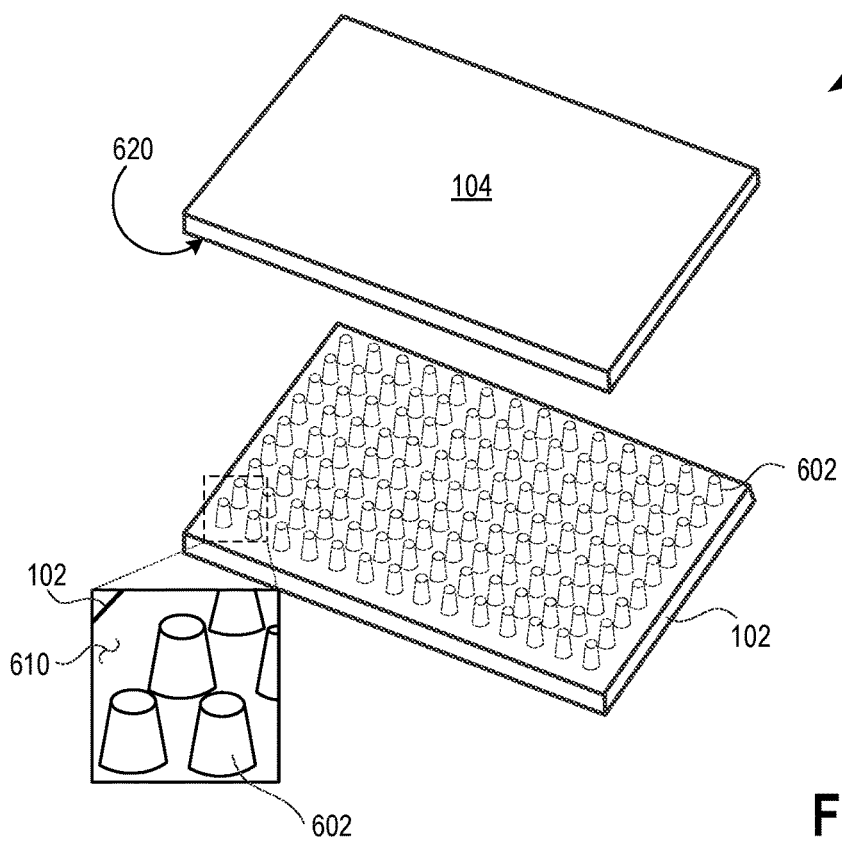
FIG. 6A is a downward-looking perspective view of an example system that includes a plurality of electrical connectors disposed across at least a portion of an upper surface of the first electrical device, each of the plurality of electrical connectors fabricated using a conductive material filled matrix, in accordance with at least one embodiment of the present disclosure.
Figure 6B:
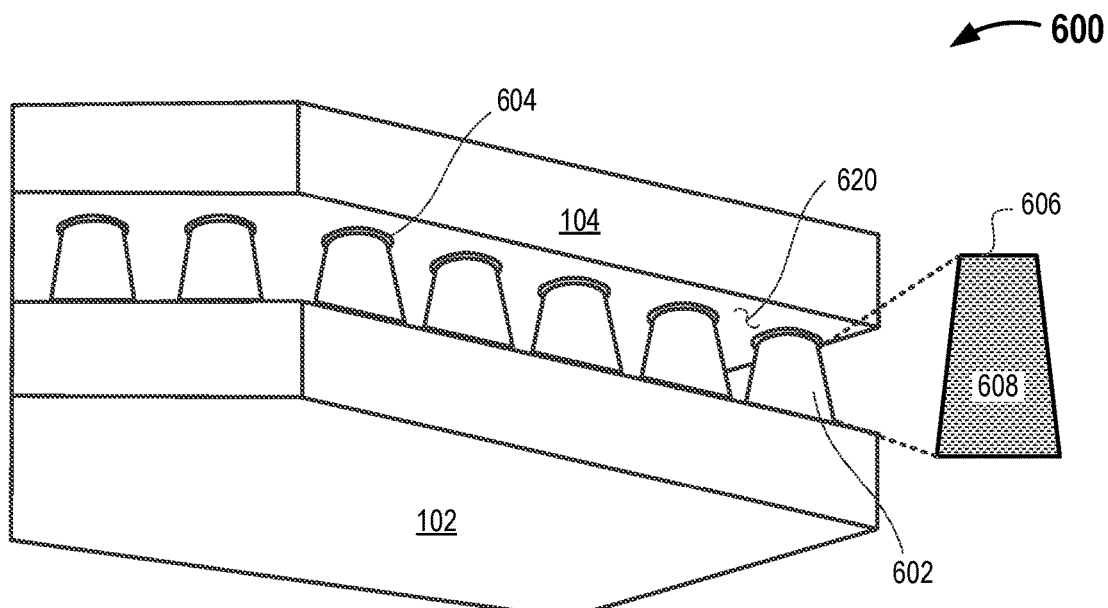
FIG. 6B is an upward-looking perspective view of the system depicted in FIG. 6A depicting a plurality of electrical contacts disposed across at least a portion of a lower surface of the second electrical device, in accordance with at least one embodiment of the present disclosure.

FIG. 6A is a downward perspective view of an illustrative system 600 that includes an example first electrical device 102 and an example second electrical device 104 in which a plurality of electrical connectors 602 disposed across an upper surface 610 of the first electrical device, in accordance with at least one embodiment of the present disclosure. FIG. 6B is an upward perspective view of the illustrative system 600 depicted in FIG. 6A that includes the example first electrical device 102 and the example second electrical device 104 depicted in FIG. 6A after a mechanical compressor causes each of the electrical connectors 602 on the upper surface 610 of the first electrical device 102 to physically and electrically conductively contact a respective electrical contact pad 604 disposed on the lower surface 620 of the second electrical device 104, in accordance with at least one embodiment of the present disclosure.

In implementations, the first electrical device 102 may include any number of electrical connectors 602. Each of the electrical connectors 602 may be physically and electrically conductively coupled to one or more contacts, contact pads, or similar devices disposed in, on, or about the first electrical device 102. In some implementations, each of the electrical connectors 602 may be conductively coupled to one or more circuits that include any number or combination of electrical devices and/or semiconductor components. In some implementations, the one or more circuits may include, but are not limited to, one or more processor or controller circuits capable of executing machine-readable code and/or logic. In some implementations, the one or more circuits may include, but are not limited to, one or more storage devices capable of storing or otherwise retaining digital data or information.

In embodiments, each of the electrical connectors 602 may include a solid member. In one or more embodiments, each of the electrical connectors 602 may include a solid member fabricated using a conductive material and having one of a number of geometric shapes, such as conical, hemispherical, trapezoidal, square, rectangular, blade-shaped, pyramidal, or a conical frustum. In some implementations, each of the electrical connectors 602 may include one or more grooves, slots, or similar openings to provide a tensioned electrical connector 602.

In some implementations, some or all of the electrical connectors 602 may include an injection molded, electrically conductive thermoplastic or thermosetting material that is physically bonded or affixed to an electrical contact or contact pad disposed on the upper surface 610 of the first electrical device 102. In some implementations, some or all of the electrical connectors 602 may include an injection molded thermoplastic, elastomeric, or polymeric compound 606 that is physically bonded or affixed to an electrical contact or contact pad disposed on the upper surface 610 of the first electrical device 102. In embodiments, the injection molded thermoplastic, elastomeric, or polymeric compound 606 may provide a support matrix for a plurality of conductive structures 608. Example conductive structures 608 may include metallic (e.g., silver, gold, aluminum, copper, combinations or alloys thereof) particles, nanowires, nanostructures, or similar objects that are evenly or unevenly dispersed or otherwise disposed throughout the injection molded thermoplastic, elastomeric, or polymeric compound 606. As depicted in FIG. 6A, the electrical connectors 602 may be physically coupled or affixed to the first electrical device 102 using the larger of the two ends of the conical frustum shaped electrical contact 602.

In implementations, the second electrical device 104 may include any number of electrical connectors 604. Each of the electrical connectors 604 may be physically and electrically conductively coupled to one or more contacts, contact pads, or similar devices disposed in, on, or about the second electrical device 104. In some implementations, each of the electrical connectors 604 may be conductively coupled to one or more circuits that include any number or combination of electrical devices and/or semiconductor components. In some implementations, the one or more circuits may include, but are not limited to, one or more processor or controller circuits capable of executing machine-readable code and/or logic. In some implementations, the one or more circuits may include, but are not limited to, one or more storage devices capable of storing or otherwise retaining digital data or information.

In embodiments, each of the electrical connectors 604 may include a contact or contact pad disposed in, on, or about the lower surface 620 of the second electrical device 104. In some implementations, some or all of the electrical connectors 604 may include an electrically conductive aperture or void into which at least a portion of the electrical connectors 602 on the first electrical device 102 may be inserted. As depicted in FIG. 6B, a mechanical compressor may physically and electrically couple the electrical connector 602 on the upper surface 610 of the first electrical device 102 with a corresponding electrical connector 604 on the lower surface 620 of the second electrical device 104.

Figure 7A:
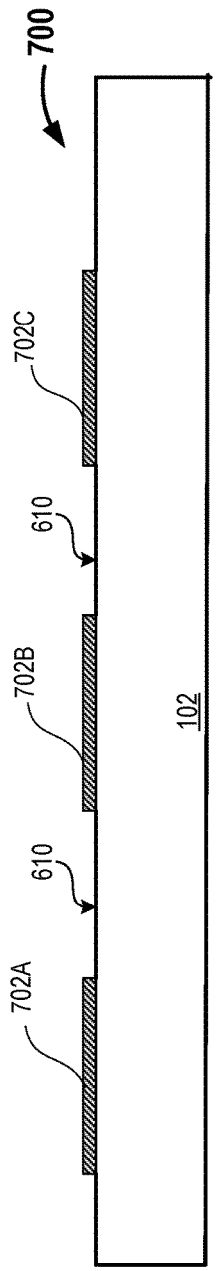
FIG. 7A is an elevation view of an example injection molding system used to fabricate the members using a conductive material disposed within a polymer matrix, in accordance with at least one embodiment of the present disclosure.

FIG. 7A is a partial cross-sectional elevation depicting an illustrative system 700 that includes a first electrical device 102 that includes a plurality of electrically conductive contact pads 702A-702n (collectively "contact pads 702"), in accordance with at least one embodiment of the present disclosure. In some implementations, the first electrical device 102 may include a number of solid, injection molded, electrically conductive electrical contacts 602, such as those depicted in FIGS. 6A and 6B. In some implementations, each of the contact pads 702 may be conductively coupled to one or more circuits that include any number or combination of electrical devices and/or semiconductor components. In some implementations, the one or more circuits may include, but are not limited to, one or more processor or controller circuits capable of executing machine-readable code and/or logic. In some implementations, the one or more circuits may include, but are not limited to, one or more storage devices capable of storing or otherwise retaining digital data or information.

Figure 7B:
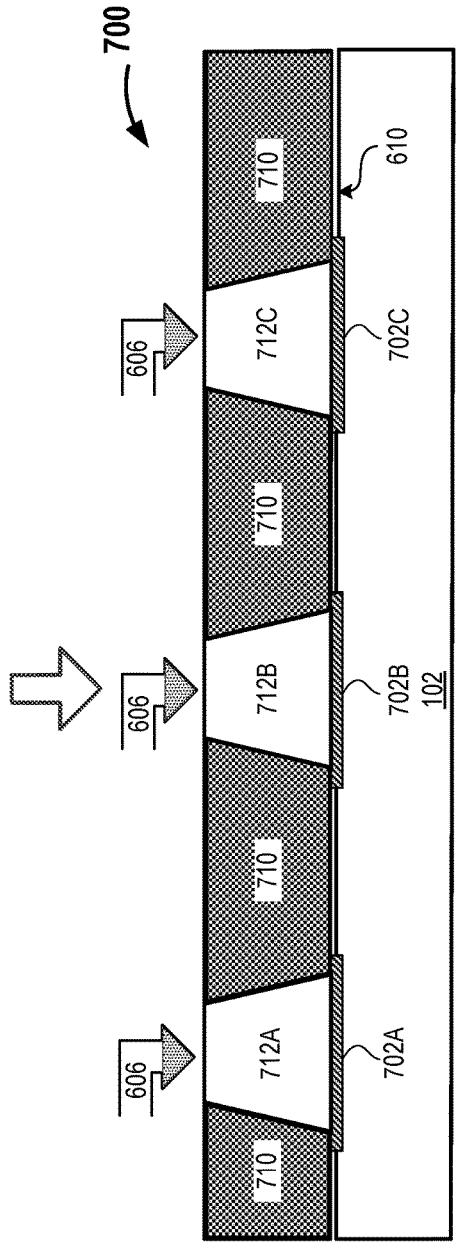
FIG. 7B is an elevation view of the example injection molding system depicted in FIG. 7A, with an illustrative injection molding die disposed proximate a number of electrical contact pads disposed across the upper surface of the first electrical device, in accordance with at least one embodiment of the present disclosure.

FIG. 7B is a partial cross-sectional elevation depicting the illustrative system 700 with an example injection mold 710 positioned proximate an upper surface 610 the first electrical device 102, in accordance with at least one embodiment of the present disclosure. In implementations, the electrical connectors 602 may be injection molded on some or all of the contact pads 702. In such embodiments, the injection molding process may create a physical and electrically conductive coupling between the electrical connector 602 and the respective contact pad 702. In embodiments, one or more thermoplastic materials 606 containing the one or more conductive structures 608 may be introduced to the mold 710. In some embodiments, one or more thermosetting materials containing one or more conductive structures 608 may be introduced to the mold 710.

Although depicted in FIG. 7B as an injection molded process using one or more thermoplastic materials capable of providing a matrix for supporting one or more conductive structures 608, the mold process is not limited to thermoplastic materials. In other embodiments, one or more thermosetting materials, such as one or more epoxy resins, may provide a matrix capable of supporting one or more conductive structures 608. In such embodiments, each of the electrical connectors 602 may be cast on a respective one of the contact pads 702 on the upper surface 610 of the electrical device 102.

Figure 7C:
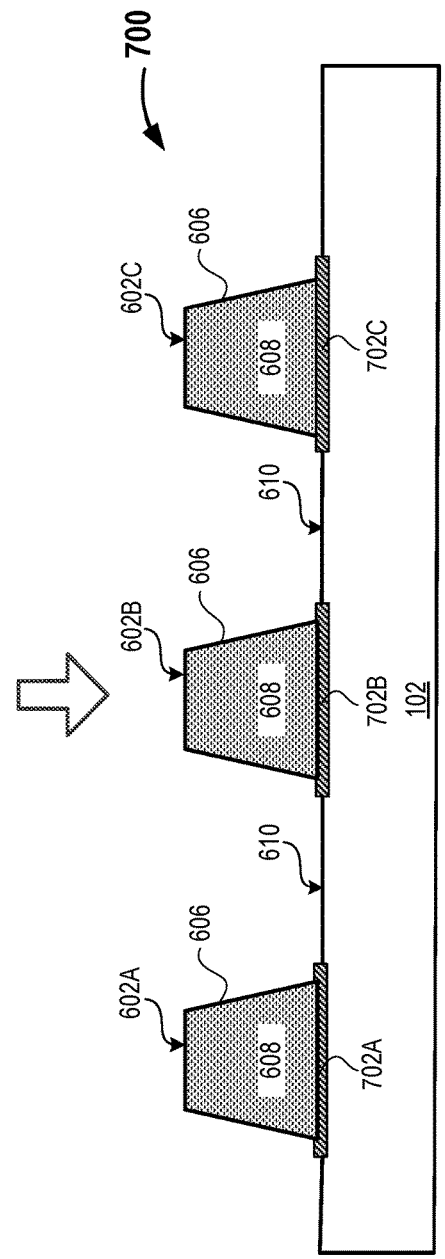
FIG. 7C is an elevation view of an illustrative conductive material filled, injection molded electrical connector, in accordance with at least one embodiment of the present disclosure.

FIG. 7C is a partial cross-sectional elevation depicting the illustrative system 700 after the injection molding process is completed and an electrical connector 602 is formed on each of at least some of the contact pads 702. In some implementations, each of the electrical connectors 602 may be physically coupled or physically affixed to at least some of the plurality of contact pads 702 by the injection molding or casting process.

Figure 8:
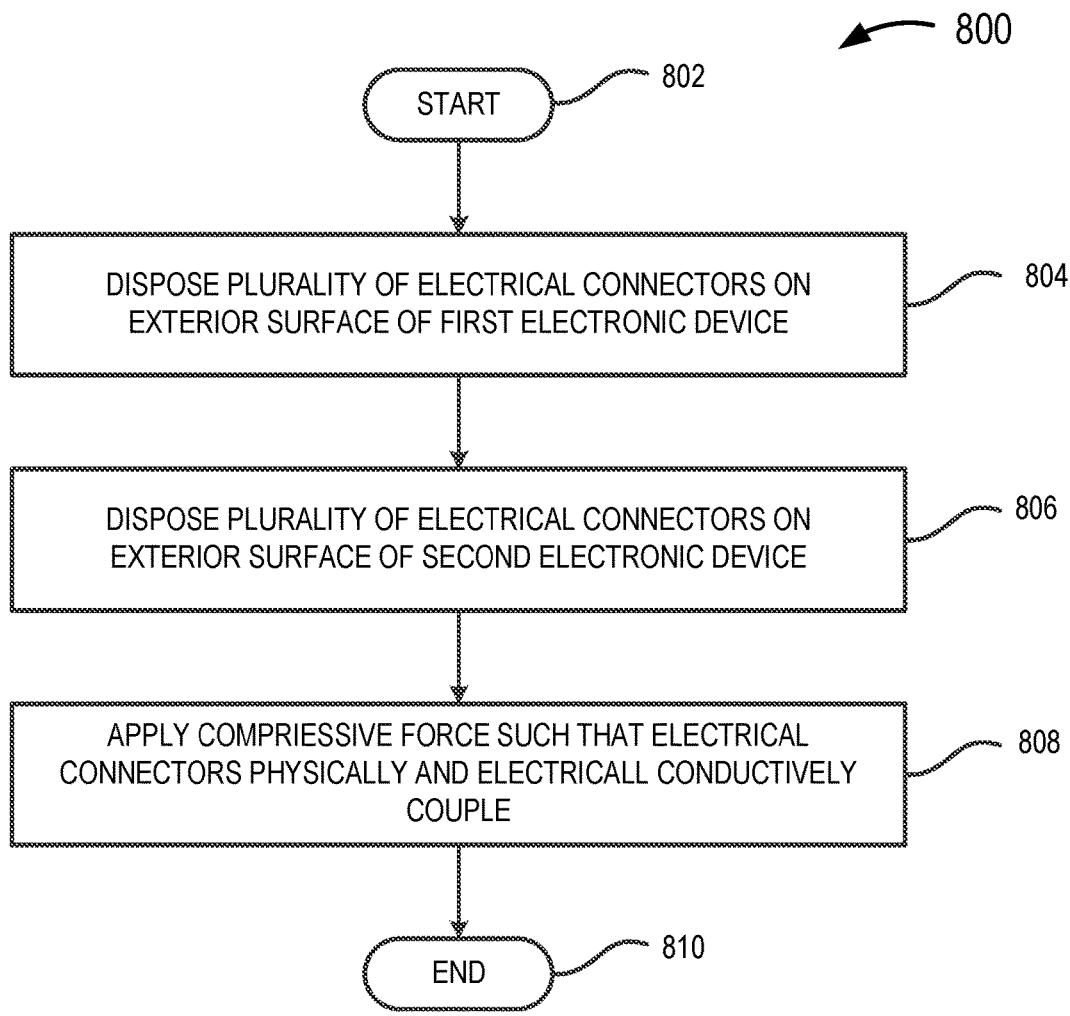
FIG. 8 is a high-level logic flow diagram of an illustrative small form factor connection method, in accordance with at least one embodiment of the present disclosure.

FIG. 8 is a high-level flow diagram depicting an illustrative method 800 of physically and electrically conductively coupling each of a plurality of electrical connections 130 on a first electrical device 102 to a corresponding one of a number of electrical contacts 132 on a second electrical device 104, in accordance with at least one embodiment of the present disclosure. In some implementations, a first electrical device 102 may include a plurality of electrical connectors 130 that are disposed in, on, or about a flexible circuit 112 that is conductively coupled to the first electrical device 102 or that are directly coupled to the first electrical device 102. In some implementations, a second electrical device 104 may include a plurality of electrical contacts 132 that are disposed in, on, or about a flexible circuit 114 that is conductively coupled to the second electrical device 104 or that are directly coupled to the second electrical device 104. A mechanical compressor may be apply a force that places each of at least some of the electrical connectors 130 coupled to the first electrical device 102 in physical and electrical contact with a respective one of a plurality of electrical contacts 132 coupled to the second electrical device 104. In some implementations, a device casing disposed about at least a portion of the first electrical device 102 and/or the second electrical device 104 may provide all or a portion of the mechanical compressor. In some implementations, one or more tensioned devices such as a spring or similar devices may provide all or a portion of the mechanical compressor. In some implementations, one or more tensioned electrical connectors may 502,504 may provide all or a portion of the mechanical compressor. The method 800 commences at 802.

At 804, a plurality of electrical connectors 130 is disposed in, on, or about an exterior surface of a first electrical device 102. In some implementations, the plurality of electrical connectors 130 may be disposed directly in, on, or about the exterior surface of the first electrical device 102. In some implementations, the plurality of electrical connectors 130 may be disposed in, on, or about a flexible circuit 112 or similar device that is conductively coupled to the first electrical device 102. In some implementations, each of the electrical connectors 130 may include a tensioned metal connector. In some implementations, each of the electrical connectors 130 may include an injection molded elastomer matrix impregnated with one or more electrically conductive materials that is physically and electrically conductively coupled to contacts or contact pads disposed in, on, or about at least a portion of an exterior surface of the first electrical device 102.

At 806, a plurality of electrical contacts 132 is disposed in, on, or about an exterior surface of a second electrical device 104. In some implementations, the plurality of electrical contacts 132 may be disposed directly in, on, or about the exterior surface of the second electrical device 104. In some implementations, the plurality of electrical contacts 132 may be disposed in, on, or about a flexible circuit 114 or similar device that is conductively coupled to the second electrical device 104. In some implementations, each of the electrical contacts 132 may include a metal contact disposed in, on, or about at least a portion of the exterior surface of the second electrical device 104.

At 808, a mechanical compressor applies a force to either or both the first electrical device 102 and/or the second electrical device 104 such that at least some of the plurality of electrical connectors 130 on the first electrical device 102 physically contact and electrically conductively couples to a respective one of the plurality of electrical contacts 132 on the second electrical device 104. In some implementations, a device casing may provide the mechanical compressor by applying a force to either or both the first electrical device 102 and/or the second electrical device 104 such that at least some of the electrical connectors 130 disposed in, on, or about the first electrical device 102 electrically couple to at least some of the electrical connectors 132 disposed in, on, or about the second electrical device 104. In some implementations, a tensioned member, such as a coil or leaf spring, may provide the mechanical compressor by applying a force to either or both the first electrical device 102 and/or the second electrical device 104 such that at least some of the electrical connectors 130 disposed in, on, or about the first electrical device 102 electrically couple to at least some of the electrical connectors 132 disposed in, on, or about the second electrical device 104. In some implementations, one or more springs, clamps, fixtures, retainers, or similar devices or appliances may provide the mechanical compressor by applying a force to either or both the first electrical device 102 and/or the second electrical device 104 such that at least some of the electrical connectors 130 disposed in, on, or about the first electrical device 102 electrically couple to at least some of the electrical connectors 132 disposed in, on, or about the second electrical device 104. The method 800 concludes at 810.

The following examples pertain to further embodiments. The following examples of the present disclosure may comprise subject material such as devices, systems, and methods that facilitate the physical and conductive coupling of electrical components and/or systems using a mechanical compressor. The mechanical compressor may take many forms including, but not limited to, a device casing exerting a lateral force against the sides of the electrical components and/or systems, a number of electrical connectors capable of generating a mechanical force that provides at least a portion of the mechanical compressor, or a number of tensioned electrical connectors capable of engaging a similarly shaped and/or configured electrical connector.

According to example 1, there is provided an electronic apparatus. The electronic apparatus may include a first electronic device that includes at least one electrical connector disposed on an exterior surface of the first electronic device. The apparatus may further include a second electronic device that includes at least one electrical contact disposed on an exterior surface of the second electronic device. The apparatus may also include a mechanical compressor, wherein the mechanical compressor applies a compressive force to the first electronic device and to the second electronic device such that the electrical connector on the first electronic device is maintained in physical and electrical contact with the electrical contact on a second electronic device.

Example 2 may include elements of example 1 where the at least one electrical connector may include a conductively coupled flex circuit disposed at least partially on an exterior surface of the first electronic device and where the at least one electrical connector may include a conductively coupled flex circuit disposed at least partially on an exterior surface of the second electronic device.

Example 3 may include elements of example 2 where the first electronic device may include a device having a first perimeter and the at least one electrical connector comprises a conductively coupled flex circuit disposed along at least a portion of the first perimeter and where the second electronic device comprises a device having a second perimeter and the at least one electrical contact may include a conductively coupled flex circuit disposed along at least a portion of the second perimeter.

Example 4 may include elements of example 3, and may additionally include a rigid casing having a first surface feature and a second surface feature, the rigid casing disposed about at least a portion of the first electronic device and the second electronic device, wherein the first surface feature and the second surface feature form at least a portion of the mechanical compressor.

Example 5 may include elements of example 4 where the first surface feature may include at least a first portion of an upturned edge of the rigid casing and wherein the second surface feature includes at least a second portion of an upturned edge of the rigid casing, the first portion of the upturned edge and the second portion of the upturned edge providing the mechanical compressor.

Example 6 may include elements of example 4 where the first surface feature may include at least a first portion of an upturned edge of the rigid casing and wherein the second surface feature may include a mechanical compressor disposed at least partially in the rigid casing.

Example 7 may include elements of example 6 where the mechanical compressor may include a spring.

Example 8 may include elements of example 2 where the second electronic device may include a device having a perimeter and the conductively coupled flex circuit is disposed along at least a portion of the perimeter of the second electronic device.

Example 9 may include elements of example 8, and may additionally include a rigid casing having a first surface feature and a second surface feature, the rigid casing disposed about at least a portion of the first electronic device and the second electronic device, where the first surface feature and the second surface feature may provide the mechanical compressor.

Example 10 may include elements of example 9 where the first electronic device and the second electronic device may be stacked within the rigid casing; where a portion of a perimeter of the first electronic device and a portion of the perimeter of the second electronic device may be disposed proximate the first surface feature; and where the flex circuit coupled to the first electronic device may be trapped between the second surface feature and the flex circuit disposed along the perimeter of the second electronic device such that the electrical connector physically and electrically couples to the electrical contact.

Example 11 may include elements of example 1 where the at least one electrical connector may include at least one tensioned, flexible, conductive whisker.

According to example 12, there is provided an electronic device coupling system. The electronic device coupling system may include a first electronic device and a second electronic device. Both the first electronic device and the second electronic device may include a member having a plurality of electrical connectors disposed on a first surface and a corresponding plurality of electrical contacts disposed on a second surface opposed to the first surface, each of the electrical contacts disposed proximate one of a corresponding plurality of apertures extending through the member from the first surface to the second surface. The electrical connectors on the first electronic device pass through the apertures on the second electronic device and contact the electrical contacts on the second electronic device; and the electrical connectors on the second electronic device contemporaneously pass through the apertures on the first electronic device and contact the electrical contacts on the first electronic device.

Example 13 may include elements of example 12, where each of the plurality of electrical connectors may include a conductive member tensioned to exert a force toward the respective first member or second member.

Example 14 may include elements of example 12 where each of the plurality of apertures may be sized to accommodate the passage of at least a portion of the electrical connectors disposed on the opposite electronic device.

Example 15 may include elements of example 12 where both the first electronic device and the second electronic device may include a rigid, planar, member.

According to example 16, there is provided an electrical device connection system. The electrical device connection system may include a first electrical device having a first surface, the first surface of the first electrical device including a plurality of electrical connectors disposed in a first pattern thereupon. The electrical device connection system may further include a second electrical device having a first surface, the first surface of the second electrical device including a plurality of electrical contacts disposed in a second pattern thereupon, the first pattern similar to the second pattern. The electrical device connection system may further include wherein the second electrical device is disposed proximate the first electrical device via one or more compression members such that each of the plurality of electrical connectors are disposed proximate a respective one of the plurality of electrical contacts.

Example 17 may include elements of example 16 where each of the plurality of electrical connectors may include a hollow member, where each of the plurality of electrical contacts may include an inverted hollow member of conductive material physically and conductively coupled to the second electrical device, the truncated cone having a third diameter proximate the second electrical device and a fourth diameter distal from the second electrical device, the fourth diameter greater than the third diameter and where the hollow member of the electrical contact on the first electrical device may be disposed within a respective inverted hollow member on the second electrical device.

Example 18 may include elements of example 17 where each of the plurality of electrical connectors may include a conductive, hollow, truncated cone physically and conductively coupled to the first electrical device, the truncated cone having a first diameter proximate the first electrical device and a second diameter distal from the second first device, the first diameter greater than the second diameter and where each of the plurality of electrical contacts may include a conductive, hollow, inverted, truncated cone physically and conductively coupled to the second electrical device, the truncated cone having a third diameter proximate the second electrical device and a fourth diameter distal from the second electrical device, the fourth diameter greater than the third diameter.

Example 19 may include elements of example 18 where each of the plurality of electrical connectors may include a truncated cone of conductive material that includes at least one conductive metal and where each of the plurality of electrical contacts may include an inverted truncated cone of conductive material that includes at least one conductive metal.

Example 20 may include elements of example 16 where each of the plurality of electrical connectors may include a member that includes one or more conductive materials embedded in a polymeric matrix; wherein each of the plurality of electrical contacts may include a member that includes a conductive material physically and conductively coupled to the second electrical device; and where each of the electrical connector members on the first electrical device may physically and conductively couple to a respective one of the electrical contact members on the second electrical device.

Example 21 may include elements of example 20 where each of the plurality of electrical connectors may include a conductive, truncated cone physically and conductively coupled to the first electrical device, the truncated cone having a first diameter proximate the first electrical device and a second diameter distal from the second first device, the first diameter greater than the second diameter; and where each of the plurality of electrical contacts may include a conductive pad physically and conductively coupled to the second electrical device.

Example 22 may include elements of example 20 where each of the members that includes one or more conductive materials embedded in a polymeric matrix may include an injection molded member physically and electrically coupled to the first electrical device.

According to example 23, there is provided a method of conductively coupling a first electronic device to a second electronic device. The method may include disposing a plurality of electrical connectors on an exterior surface of the first electronic device, disposing a plurality of electrical contacts on an exterior surface of the second electronic device, and applying a compressive force to the first electronic device and the second electronic device such that each of electrical connectors on the exterior surface of the first electronic device physically and electrically couple to a respective one of the electrical contacts on the exterior surface of the second electronic device.

Example 24 may include elements of example 23 where disposing a plurality of electrical connectors on an exterior surface of the first electronic device may include conductively coupling a flex circuit to at least a portion of the exterior surface of the first electronic device, the flex circuit including the plurality of electrical connectors.

Example 25 may include elements of example 24 where disposing a plurality of electrical contacts on an exterior surface of the second electronic device may include conductively coupling a flex circuit to at least a portion of the exterior surface of the second electronic device, the flex circuit including the plurality of electrical contacts.

Example 26 may include elements of example 23 where disposing a plurality of electrical connectors on an exterior surface of the first electronic device may include physically and conductively coupling a plurality of electrical connectors to pads disposed on at least a portion of the exterior surface of the first electronic device, each of the plurality of electrical connectors may include a conic frustum of one or more conductive materials embedded in a polymeric matrix, the conic frustum physically and conductively coupled to the first electrical device, the truncated cone having a first diameter proximate the first electrical device and a second diameter distal from the second first device, the first diameter greater than the second diameter.

Example 27 may include elements of example 26 where disposing a plurality of electrical contacts on an exterior surface of the second electronic device may include physically and conductively coupling a plurality of electrical contact pads on at least a portion of the exterior surface of the second electronic device.

Example 28 may include elements of example 23 where disposing a plurality of electrical connectors on an exterior surface of the first electronic device may include physically and conductively coupling a plurality of electrical connectors to pads disposed on at least a portion of the exterior surface of the first electronic device, each of the plurality of electrical connectors may include a conic frustum of conductive material physically and conductively coupled to the first electrical device, the conic frustum having a first diameter proximate the first electrical device and a second diameter distal from the second first device, the first diameter greater than the second diameter.

Example 29 may include elements of example 28 where disposing a plurality of electrical contacts on an exterior surface of the second electronic device may include physically and conductively coupling a plurality of electrical connectors to pads disposed on at least a portion of the exterior surface of the first electronic device, each of the plurality of electrical connectors may include an inverted conic frustum of conductive material physically and conductively coupled to the second electrical device, the inverted conic frustum having a third diameter proximate the second electrical device and a fourth diameter distal from the second electrical device, the fourth diameter greater than the third diameter.

Example 30 may include elements of example 23 where disposing a plurality of electrical connectors on an exterior surface of the first electronic device may include physically and conductively coupling a plurality of electrical connectors to pads disposed on a first portion of the exterior surface of the first electronic device, physically and conductively coupling a respective plurality of electrical pads disposed on a second portion of the exterior surface of the first electronic device, the second portion of the exterior surface disposed opposite the first portion of the exterior surface of the first electronic device, and disposing a respective plurality of apertures through the first electronic device, each of the apertures extending from a first portion of the exterior surface to the second portion of the exterior surface of the first electronic device.

Example 31 may include elements of example 30 where physically and conductively coupling a plurality of electrical connectors to pads disposed on a first portion of an exterior surface of the first electronic device may include physically and conductively coupling a plurality of electrical connectors, each of the electrical connectors including a conductive member tensioned to exert a force toward the first member, to pads disposed on at least the first portion of the exterior surface of the first electronic device.

Example 32 may include elements of example 31 where disposing a plurality of electrical contacts on an exterior surface of the second electronic device may include physically and conductively coupling a plurality of electrical connectors to pads disposed on a first portion of an exterior surface of the second electronic device, physically and conductively coupling a respective plurality of electrical pads disposed on a second portion of the exterior surface of the second electronic device, the second portion of the exterior surface disposed opposite the first portion of the exterior surface of the second electronic device, and disposing a respective plurality of apertures through the second electronic device, each of the apertures extending from a first portion of the exterior surface to the second portion of the exterior surface of the second electronic device.

Example 33 may include elements of example 32 where physically and conductively coupling a plurality of electrical connectors to pads disposed on a first portion of an exterior surface of the second electronic device may include physically and conductively coupling a plurality of electrical connectors, each of the electrical connectors including a conductive member tensioned to exert a force toward the first surface of the second member, to pads disposed on the first portion of the exterior surface of the second electronic device.

Example 34 may include elements of example 33 where applying a compressive force to the first electronic device and the second electronic device such that each of electrical connectors on the exterior surface of the first electronic device physically and electrically couple to a respective one of the electrical contacts on the exterior surface of the second electronic device may include passing each of the plurality of electrical connectors on the first portion of the first electrical device through a respective one the plurality of apertures in the second electrical device, passing the each of the plurality of electrical connectors on the first portion of the second electrical device through a respective one the plurality of apertures in the first electrical device, and laterally displacing at least one of the first electrical device or the second electrical device such that: each of the plurality of electrical connectors on the first portion of the first electrical device is disposed proximate a respective one of the plurality of electrical contact pads on the second portion of the second electrical device, and each of the plurality of electrical connectors on the first portion of the first electrical device provides at least a portion of the compressive force to the first electronic device and the second electronic device and each of the plurality of electrical connectors on the first portion of the second electrical device is disposed proximate a respective one of the plurality of electrical contact pads on the second portion of the first electrical device, and each of the plurality of electrical connectors on the first portion of the second electrical device provides at least a portion of the compressive force to the first electronic device and the second electronic device.

According to example 35, there is provided a system for conductively coupling a first electronic device to a second electronic device. The system may include a means for disposing a plurality of electrical connectors on an exterior surface of the first electronic device, a means for disposing a plurality of electrical contacts on an exterior surface of the second electronic device, and a means for applying a compressive force to the first electronic device and the second electronic device such that each of electrical connectors on the exterior surface of the first electronic device physically and electrically couple to a respective one of the electrical contacts on the exterior surface of the second electronic device.

Example 36 may include elements of example 35 where the means for disposing a plurality of electrical connectors on an exterior surface of the first electronic device may include: a means for conductively coupling a flex circuit to at least a portion of the exterior surface of the first electronic device, the flex circuit including the plurality of electrical connectors.

Example 37 may include elements of example 36 where the means for disposing a plurality of electrical contacts on an exterior surface of the second electronic device may include a means for conductively coupling a flex circuit to at least a portion of the exterior surface of the second electronic device, the flex circuit including the plurality of electrical contacts.

Example 38 may include elements of example 35 where the means for disposing a plurality of electrical connectors on an exterior surface of the first electronic device may include a means for physically and conductively coupling a plurality of electrical connectors to pads disposed on at least a portion of the exterior surface of the first electronic device, each of the plurality of electrical connectors may include a conic frustum of one or more conductive materials embedded in a polymeric matrix, the truncated cone physically and conductively coupled to the first electrical device, the conic frustum having a first diameter proximate the first electrical device and a second diameter distal from the second first device, the first diameter greater than the second diameter.

Example 39 may include elements of example 38 where the means for disposing a plurality of electrical contacts on an exterior surface of the second electronic device may include a means for physically and conductively coupling a plurality of electrical contact pads on at least a portion of the exterior surface of the second electronic device.

Example 40 may include elements of example 35 where the means for disposing a plurality of electrical connectors on an exterior surface of the first electronic device may include a means for physically and conductively coupling a plurality of electrical connectors to pads disposed on at least a portion of the exterior surface of the first electronic device, each of the plurality of electrical connectors may include a conic frustum of conductive material physically and conductively coupled to the first electrical device, the conic frustum having a first diameter proximate the first electrical device and a second diameter distal from the second first device, the first diameter greater than the second diameter.

Example 41 may include elements of example 40 where the means for disposing a plurality of electrical contacts on an exterior surface of the second electronic device may include a means for physically and conductively coupling a plurality of electrical connectors to pads disposed on at least a portion of the exterior surface of the first electronic device, each of the plurality of electrical connectors may include an inverted conic frustum of conductive material physically and conductively coupled to the second electrical device, the inverted conic frustum having a third diameter proximate the second electrical device and a fourth diameter distal from the second electrical device, the fourth diameter greater than the third diameter.

Example 42 may include elements of example 35 where the means for disposing a plurality of electrical connectors on an exterior surface of the first electronic device may include a means for physically and conductively coupling a plurality of electrical connectors to pads disposed on a first portion of the exterior surface of the first electronic device a means for physically and conductively coupling a respective plurality of electrical pads disposed on a second portion of the exterior surface of the first electronic device, the second portion of the exterior surface disposed opposite the first portion of the exterior surface of the first electronic device and a means for disposing a respective plurality of apertures through the first electronic device, each of the apertures extending from a first portion of the exterior surface to the second portion of the exterior surface of the first electronic device.

Example 43 may include elements of example 42 where the means for physically and conductively coupling a plurality of electrical connectors to pads disposed on a first portion of an exterior surface of the first electronic device may include a means for physically and conductively coupling a plurality of electrical connectors, each of the electrical connectors including a conductive member tensioned to exert a force toward the first member, to pads disposed on at least the first portion of the exterior surface of the first electronic device.

Example 44 may include elements of example 43 where the means for disposing a plurality of electrical contacts on an exterior surface of the second electronic device may include a means for physically and conductively coupling a plurality of electrical connectors to pads disposed on a first portion of an exterior surface of the second electronic device, a means for physically and conductively coupling a respective plurality of electrical pads disposed on a second portion of the exterior surface of the second electronic device, the second portion of the exterior surface disposed opposite the first portion of the exterior surface of the second electronic device; and a means for disposing a respective plurality of apertures through the second electronic device, each of the apertures extending from a first portion of the exterior surface to the second portion of the exterior surface of the second electronic device.

Example 45 may include elements of example 43 where the means for physically and conductively coupling a plurality of electrical connectors to pads disposed on a first portion of an exterior surface of the second electronic device may include a means for physically and conductively coupling a plurality of electrical connectors, each of the electrical connectors including a conductive member tensioned to exert a force toward the first surface of the second member, to pads disposed on the first portion of the exterior surface of the second electronic device.

Example 46 may include elements of example 44 where the means for applying a compressive force to the first electronic device and the second electronic device such that each of electrical connectors on the exterior surface of the first electronic device physically and electrically couple to a respective one of the electrical contacts on the exterior surface of the second electronic device may include a means for passing each of the plurality of electrical connectors on the first portion of the first electrical device through a respective one the plurality of apertures in the second electrical device; a means for passing the each of the plurality of electrical connectors on the first portion of the second electrical device through a respective one the plurality of apertures in the first electrical device; and a means for laterally displacing at least one of the first electrical device or the second electrical device such that: each of the plurality of electrical connectors on the first portion of the first electrical device is disposed proximate a respective one of the plurality of electrical contact pads on the second portion of the second electrical device, and each of the plurality of electrical connectors on the first portion of the first electrical device provides at least a portion of the compressive force to the first electronic device and the second electronic device; and each of the plurality of electrical connectors on the first portion of the second electrical device is disposed proximate a respective one of the plurality of electrical contact pads on the second portion of the first electrical device, and each of the plurality of electrical connectors on the first portion of the second electrical device provides at least a portion of the compressive force to the first electronic device and the second electronic device.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. An electrical device connection system, comprising:
a first electrical device having a first surface and an opposing second surface, a first tensioned electrical connector attached to said first surface, and first electrical contacts disposed on said second surface;
wherein:
said first electrical device is formed to include a first aperture extending therethrough;
a first end of said first tensioned electrical connector is attached to said first surface adjacent said first aperture;
a second electrical device having a third surface and an opposing fourth surface, a second tensioned electrical connector attached to said third surface, and second electrical contacts disposed on said fourth surface;
wherein:
said second electrical device is formed to include a second aperture extending therethrough;
a first end of said second tensioned electrical connector is attached to said third surface adjacent said second aperture;
wherein:
said first device and said second device have a facing relationship such that said first surface faces said third surface;
a second end of said second tensioned electrical connector extends into, through, and outwardly from, said first aperture;
said second end of said second tensioned electrical connector is in electrical contact with said first electrical contacts disposed on said first surface, thereby establishing electrical connection between said first device and said second device;
said second end of said second tensioned electrical connector exerts a compressive force in a first direction on said first device, thereby mechanically attaching said first device to said second device;
a second end of said first tensioned electrical connector extends into, through, and outwardly from, said second aperture;
said second end of said first tensioned electrical connector is in electrical contact with said second electrical contacts disposed on said fourth surface, thereby establishing electrical connection between said first device and said second device;
said second end of said first tensioned electrical connector exerts a compressive force in a second and opposing direction on said second device, thereby mechanically attaching said first device to said second device.

2. The electrical device connection system of claim 1:
wherein each of the plurality of first electrical connectors comprise a hollow member;
wherein each of the plurality of second electrical contacts comprise an inverted hollow member of conductive material physically and conductively coupled to the second electrical device; and
wherein a hollow member of the electrical contact on the first electrical device fits within a respective inverted hollow member on the second electrical device.

3. The electrical device connection system of claim 2:
wherein each of the first plurality of electrical connectors comprise a conductive, hollow, conic frustum physically and conductively coupled to the first electrical device, the conic frustum having a first diameter proximate the first electrical device and a second diameter distal from the second first device, the first diameter greater than the second diameter; and
wherein each of the second plurality of electrical contacts comprise a conductive, hollow, inverted, conic frustum physically and conductively coupled to the second electrical device, the inverted conic frustum having a third diameter proximate the second electrical device and a fourth diameter distal from the second electrical device, the fourth diameter greater than the third diameter.

4. The electrical device connection system of claim 1:
wherein each of the plurality of first electrical connectors comprise a member that includes one or more conductive materials embedded in a thermoplastic matrix;
wherein each of the plurality of second electrical contacts comprise a member that includes a conductive material physically and conductively coupled to the second electrical device; and
wherein each of the electrical connector members on the first electrical device physically and electrically conductively couples to a respective one of the electrical contact members on the second electrical device.

5. The electrical device connection system of claim 4:
wherein each of the plurality of first electrical connectors comprise a conductive, conic frustum physically and conductively coupled to the first electrical device, the conic frustum having a first diameter proximate the first electrical device and a second diameter distal from the second first device, the first diameter greater than the second diameter; and
wherein each of the plurality of second electrical contacts comprise a conductive pad physically and conductively coupled to the second electrical device.

6. The electrical device connection system of claim 4:
wherein each of the members that includes one or more conductive materials embedded in a thermoplastic matrix comprises an injection molded member physically and electrically coupled to the first electrical device.

7. A method of conductively coupling a first electronic device to a second electronic device, the method comprising:
providing a first electrical device having a first surface and an opposing second surface, a first tensioned electrical connector attached to said first surface, a first plurality of first electrical connectors on said first surface of the first electronic device and first electrical contacts disposed on said second surface, wherein said first electrical device is formed to include a first aperture extending therethrough, and wherein a first end of said first tensioned electrical connector is attached to said first surface adjacent said first aperture;
providing a second electrical device having a third surface and an opposing fourth surface, a second tensioned electrical connector attached to said third surface, a second plurality of second electrical connectors on said third surface, and second electrical contacts disposed on said fourth surface, wherein said second electrical device is formed to include a second aperture extending therethrough, and wherein a first end of said second tensioned electrical connector is attached to said third surface adjacent said second aperture;
inserting a second end of said second tensioned electrical connector into, through, and outwardly from, said first aperture;
placing said second end of said second tensioned electrical connector in electrical contact with said first electrical contacts disposed on said first surface, thereby establishing electrical connection between said first device and said second device;
wherein said second end of said second tensioned electrical connector exerts a compressive force in a first direction on said first device, thereby mechanically attaching said first device to said second device;
inserting a second end of said first tensioned electrical connector into, through, and outwardly from, said second aperture;
placing said second end of said first tensioned electrical connector is electrical contact with said second electrical contacts disposed on said fourth surface, thereby establishing electrical connection between said first device and said second device;
wherein said second end of said first tensioned electrical connector exerts a compressive force in a second and opposing direction on said second device, thereby mechanically attaching said first device to said second device.

8. The method of claim 7, further comprising:
physically and conductively coupling a plurality of first electrical connectors to first pads disposed on at least a portion of said first surface of the first electronic device, each of the first plurality of electrical connectors comprising:
a conic frustum of one or more conductive materials embedded in a polymeric matrix, the conic frustum physically and conductively coupled to the first electrical device, the truncated cone having a first diameter proximate the first electrical device and a second diameter distal from the second first device, the first diameter greater than the second diameter.

9. The method of claim 8, further comprising:
physically and conductively coupling a second plurality of second electrical contact pads on at least a portion of said third surface of the second electronic device.

10. The method of claim 7, further comprising:
physically and conductively coupling a plurality of electrical connectors to pads disposed on at least a portion of the first surface of the first electronic device;
wherein each of the first plurality of first electrical connectors comprises a conic frustum of conductive material physically and conductively coupled to the first electrical device, the conic frustum having a first diameter proximate the first electrical device and a second diameter distal from the second first device, the first diameter greater than the second diameter.

11. The method of claim 10, further comprising:
physically and conductively coupling a second plurality of second electrical connectors to pads disposed on at least a portion of the third surface of the second electronic device;
wherein each of the second plurality of electrical connectors comprises an inverted conic frustum of conductive material physically and conductively coupled to the second electrical device, the conic frustum having a third diameter proximate the second electrical device and a fourth diameter distal from the second electrical device, the fourth diameter greater than the third diameter.

* * * * *